(12) United States Patent
Narihiro

(10) Patent No.: US 7,989,855 B2
(45) Date of Patent: Aug. 2, 2011

(54) SEMICONDUCTOR DEVICE INCLUDING A DEFLECTED PART

(75) Inventor: Mitsuru Narihiro, Tokyo (JP)

(73) Assignee: NEC Corporation, Tokyo (JP)

( * ) Notice: Subject to any disclaimer, the term of this patent is extended or adjusted under 35 U.S.C. 154(b) by 335 days.

(21) Appl. No.: 11/628,976

(22) PCT Filed: Jun. 3, 2005

(86) PCT No.: PCT/JP2005/010237
§ 371 (c)(1),
(2), (4) Date: Dec. 8, 2006

(87) PCT Pub. No.: WO2005/122276
PCT Pub. Date: Dec. 22, 2005

(65) Prior Publication Data
US 2007/0241414 A1    Oct. 18, 2007

(30) Foreign Application Priority Data
Jun. 10, 2004  (JP) .................................. 2004-172846

(51) Int. Cl.
*H01L 29/78* (2006.01)
*H01L 21/336* (2006.01)

(52) U.S. Cl. ........ 257/288; 257/287; 257/368; 257/401; 257/E21.442

(58) Field of Classification Search .................. 257/368, 257/E21.442, 287, 288, 401; 438/197
See application file for complete search history.

(56) References Cited

U.S. PATENT DOCUMENTS

| 6,567,715 B1* | 5/2003 | Sinclair et al. ................ 700/110 |
| 2004/0108559 A1* | 6/2004 | Sugii et al. ..................... 257/411 |
| 2005/0062080 A1* | 3/2005 | Nakamura et al. ............ 257/288 |
| 2006/0214232 A1* | 9/2006 | Chen et al. ..................... 257/351 |
| 2007/0072380 A1* | 3/2007 | Wirbeleit et al. ............. 438/303 |

FOREIGN PATENT DOCUMENTS

| JP | 09-321307 | 12/1997 |
| JP | 10-022501 | 1/1998 |
| JP | 2000-277715 | 10/2000 |
| JP | 2001-144276 | 5/2001 |
| JP | 2002-057329 | 2/2002 |
| JP | 2003-037272 | 2/2003 |
| JP | 2003-243667 | 8/2003 |
| JP | 2004-128185 | 4/2004 |
| WO | WO 2005/022637 A1 | 3/2005 |
| WO | WO 2005/038931 A1 | 4/2005 |
| WO | WO 2005/091374 A1 | 9/2005 |
| WO | WO 2005/122272 A1 | 12/2005 |
| WO | WO 2006/006424 | 1/2006 |
| WO | WO 2006/011369 A1 | 2/2006 |

OTHER PUBLICATIONS

Masayoshi Esash ed., "Micromachine-a small and high-performance system in which various elements are integrated". Industrial Technology Service Center, Feb. 18, 2002, pp. 221-231, Jiro Sakata "Section 3: Measures to Sticking".

J. Foucher, et al., "Design of notched gate process in high density plasma," Journal of Vacuum Science and Technology, p. 2024-2031, vol. B20, No. 5, Sep./Oct., 2002.

* cited by examiner

*Primary Examiner* — Hung Vu
*Assistant Examiner* — Vernon P Webb
(74) *Attorney, Agent, or Firm* — McGinn IP Law Group, PLLC

(57) ABSTRACT

This invention relates to a semiconductor device having a beam made of a semiconductor to which strain is introduced by deflection, and a current is permitted to flow in the beam.

16 Claims, 31 Drawing Sheets

(a)

(b)

(c)

(d)

(e)

(f)

(a)

(b)

SEMICONDUCTOR DEVICE INCLUDING A DEFLECTED PART

TECHNICAL FIELD

The present invention relates to a semiconductor device and a manufacturing process therefor, particularly to a semiconductor device in which mobility is improved by strain and a manufacturing process therefor.

BACKGROUND OF THE INVENTION

Recently, it has become significantly difficult to reduce the size of an integrated circuit in accordance with the scaling rule. As one of the reasons, it has been difficult to restrain short-channel effect in a MOS (Metal-Oxide-Semiconductor) type FET (Field Effect Transistor) as an elementary element in an integrated circuit. For solving this problem, there has been proposed an FET having a double gate structure (Non-patent reference 1: Applied Physics, The Japan Society of Applied Physics, 2003, Vol. 72 (9), pp. 1136-1142). A double-gate structure FET may have three configurations depending on arrangement of a source electrode, a drain electrode and two gate electrodes as described in Non-patent reference 1, and among these, FinFET (Fin-type channel FET) is believed to be practically used because an existing integrated circuit process may be easily applied to it.

FIG. 29 schematically shows a common FinFET as described in Non-patent reference 1. The FinFET is formed in an SOI (Silicon on Insulator) layer on a Si substrate 1 and a buried oxide film 2. The SOI layer has pads for a source electrode 3 and for a drain electrode 4, which are connected via a fin 5. There is formed a hard mask 9 in the upper surface of the fin 5 under a gate electrode 6 and there is formed a gate insulating film 7 between the side surface of the fin 5 and the gate electrode 6. By forming such a structure, channels are formed in both side surfaces of the fin 5, to realize a double gate structure. Such a FinFET is called as a double-gate type FinFET.

Besides a double-gate type FinFET, a triple-gate type FinFET is also known, in which a channel is formed in the upper side of the fin 5 as shown in FIG. 30 (Non-patent reference 2: 2003 Symposium on VLSI Technology Digest of Technical Papers, 2003, pp. 133-134). A triple-gate type FinFET is different from a double type FinFET in that a gate insulating film 7 is formed instead of a hard mask 9 in the upper side of the fin 5 under the gate electrode 6.

Meanwhile, for an existing bulk MOS device, a strained Si technique has been investigated for improving channel mobility and increasing a channel speed to improve an ON current while a supply voltage is reduced. In this technique, a Si lattice spacing is changed by applying stress to Si in a channel, to modulate a Si band structure. As a result, in a Si conduction band, degeneracy is broken to increase an electron occupancy of a double degeneracy valley with a light effective mass and interband scattering between a double degeneracy valley and a quadruple degeneracy valley is inhibited, resulting in improvement in mobility. In a valence band, it is believed that mobility is improved by breaking of degeneracy, inhibition of interband scattering between a light hole band and a heavy hole band and reduction in an effective mass.

Strain Si techniques can be generally classified into two types, depending on the way of applying strain to a channel Si.

A first method involves epitaxial growth of a Si layer on a relaxed SiGe layer (FIG. 1 in Non-patent reference 3; Applied Physics, The Japan Society of Applied Physics, Vol. 72 (3), 2003, pp. 220-290). First, as shown in FIG. 31, on a Si substrate 1 are sequentially formed a gradient type SiGe buffer 17 and a lattice-relaxed SiGe 18. In the gradient type SiGe buffer 17, a composition ratio X of Ge in SiGe is increased from 0% to x % (x is generally about from 10 to 30 or 40) toward the upper surface of the substrate. In the lattice-relaxed SiGe 18, SiGe is grown to relax a lattice while maintaining a high composition ratio X of Ge in SiGe. Since a lattice constant of Ge is larger than that of Si, lattice-relaxed SiGe has a larger lattice constant than that of Si. Therefore, a Si layer grown on a lattice-relaxed SiGe 18 such that the lattice matching occurs, has a larger lattice constant than that of a bulk Si and thus becomes a strained Si 19. When manufacturing a MOS type FET using such a strained Si layer as shown in FIG. 31, strain introduced in a channel improves mobility.

As shown FIG. 32, there is another method in which on a buried oxide film 2 is formed a lattice-relaxed SiGe 18 to form a SGOI (SiGe on Insulator) structure, on which a Si layer is grown to give a strained Si 19 (FIG. 3 in Non-patent reference 3).

Previous experimental results for a (100) plane have shown that a substrate Ge concentration x=25% (corresponding to about 1% strain) improves mobility by about 60 to 80% for electrons and about 20 to 50% for holes (FIG. 2 in Non-patent reference 3).

However, a relaxed SiGe layer giving strain to a channel Si layer has many dislocations and defects, so that it transfers dislocations and defects to the channel Si layer, leading to tendency to ingenerate dislocations and defects in the channel Si layer. Thus, when using the first method, a single MOS transistor may operate while it is difficult to operate an integrated circuit. Even if the integrated circuit operates, it is difficult to ensure a process yield.

The second method involves utilization of process strain. As process strain, strain generated by a capping layer or an STI (Shallow Trench Isolation) and so on can be used (Non-patent reference 4: International Electron Device Meeting Technical Digest, 2001, pp. 433-436). For example, as shown in FIG. 33, a nitride film is used as a capping layer 20 and a tension of the nitride film is utilized to apply strain to Si in a channel.

However, in the second method, strain is hard to be directly applied to a channel and it is difficult to control the amount of strain. It is because a capping layer or STI giving strain is distant from a channel region and thus strain is applied to the channel region via another substance.

SUMMARY OF THE INVENTION

An objective of the present invention is to provide a semiconductor device in which carrier mobility is improved by introducing strain by employing a novel structure. Another objective is to provide a semiconductor device with less dislocations or defects and a controlled amount of strain. Another objective is to provide a process for manufacturing such a semiconductor device.

The present invention relates to the followings.

[1] A semiconductor device wherein a current flows in a deflected beam made of a semiconductor.

[2] The semiconductor device as described in [1], wherein the beam has a doubly-clamped beam structure in which both ends are fixed and tensile strain is applied in a beam direction.

[3] The semiconductor device as described in [1] or [2], wherein the beam is used as a channel region in an FET.

[4] The semiconductor device as described in [3], wherein the FET is a FinFET which uses at least the side surface of the beam as a channel region.

[5] The semiconductor device as described in [3], wherein the FET is a planar type FET which uses the upper surface of the beam as a channel region.

[6] The semiconductor device as described in any of [2] to [5], wherein the center of the beam is in contact with a void bottom under the beam.

[7] The semiconductor device as described in [6], wherein the strain in the beam is controlled by the length of the beam before the beam is deflected and the depth of the void under the beam.

[8] The semiconductor device as claimed in claim 7, wherein the semiconductor device comprises a plurality of FinFETs and comprises at least two types of FinFETs in which strain is differently introduced by altering at least one of the length of the beam before the beam is deflected and the depth of the void under the beam.

[9] A process for manufacturing a semiconductor device wherein a current flows in a deflected beam made of a semiconductor, comprising the steps of:
forming a straight beam having a doubly-clamped beam structure made of the semiconductor by forming a void under the beam;
filling the void with a liquid; and
contacting the center of the beam with the bottom of the void by drying the liquid to form a deflected beam.

[10] The process for manufacturing a semiconductor device as described in [9], wherein the liquid is water or mercury.

[11] The process for manufacturing a semiconductor device as claimed in Claim 9 or 10, further comprising preparing a substrate having a first layer made of the semiconductor constituting the beam and a second layer under the first layer which is made of a material having a different etching rate from the first layer before the forming the straight beam having a doubly-clamped beam structure,
wherein the forming the straight beam having a doubly-clamped beam structure is forming a void in a part under the first layer by etching off at least part of the second layer.

[12] A process for manufacturing a FinFET comprising the step of:
preparing an SOI substrate in which a buried insulating film and a semiconductor layer are stacked on a substrate;
patterning the semiconductor layer to form a Fin having a given width;
forming a void under the Fin by etching the buried insulating film under the Fin to provide a straight beam;
filling the void with a liquid; and
contacting the Fin with the bottom of the void by drying the liquid to deflect the Fin.

The present invention utilizes deflection for applied strain to a semiconductor layer. Particularly, by deflecting a beam from a doubly-clamped beam structure, strain is introduced in the beam in proportion to the amount of deflection. In such a structure, strain is introduced differently from a conventional process in which strain is introduced based on lamination of semiconductor layers different in a lattice constant, so that dislocations or defects caused by a lower semiconductor layer are avoided. Thus, it can improve reliability and give a good process yield during production, resulting in a semiconductor device allowing for high speed operation. Unlike the case where strain is introduced by, for example, a capping layer, since strain can be directly controlled by deflection in this structure, this structure has advantage of facilitating designing of a semiconductor device.

In one aspect of the manufacturing process according to the present invention, since utilizing sticking phenomenon caused by a liquid surface tension while beam is deflected, dislocations or defects can be avoided, resulting in higher reliability and a good process yield. Furthermore, since strain can be easily controlled by deflection, the present invention has advantage of facilitating designing of a semiconductor device.

DETAILED DESCRIPTION OF THE INVENTION

A semiconductor device of the present invention is configured such that carriers (electrons and/or holes) move in a deflected beam, that is, a current flows. In the deflected beam, strain is introduced to give a semiconductor device capable of operating at a high speed because mobility of moving carriers in the beams is improved. It can be, therefore, applied to various devices in which electrons and/or holes move in a deflected beam and their moving velocity is responsible for device performance. A typical example is an aspect in which in FET (Field Effect Transistor), a deflected beam is used as a channel region.

Particularly, in a structure where a deflected beam is a deflected doubly-clamped beam, tensile strain can be surely introduced into a semiconductor layer constituting the beam. A doubly-clamped beam is a beam fixed at both ends, and tensile strain can be introduced in a beam direction by deflecting the doubly-clamped beam.

Figure 34:
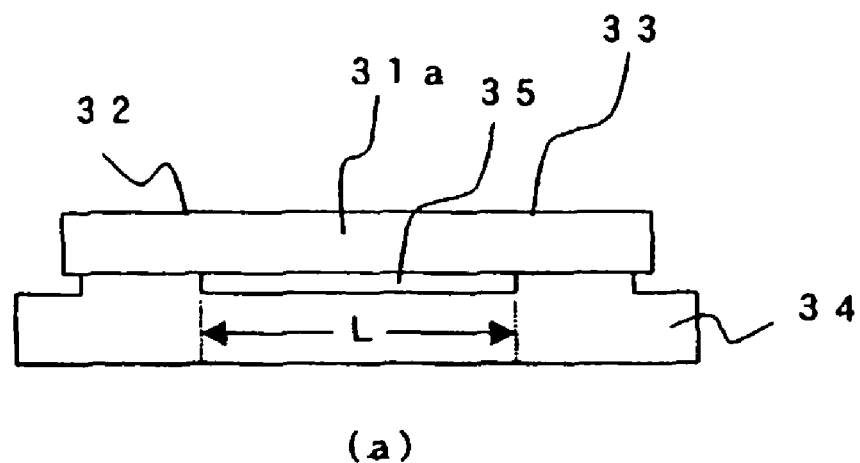
FIG. 34 is a drawing for illustrating a beam structure according to the present invention.
Figure 34:
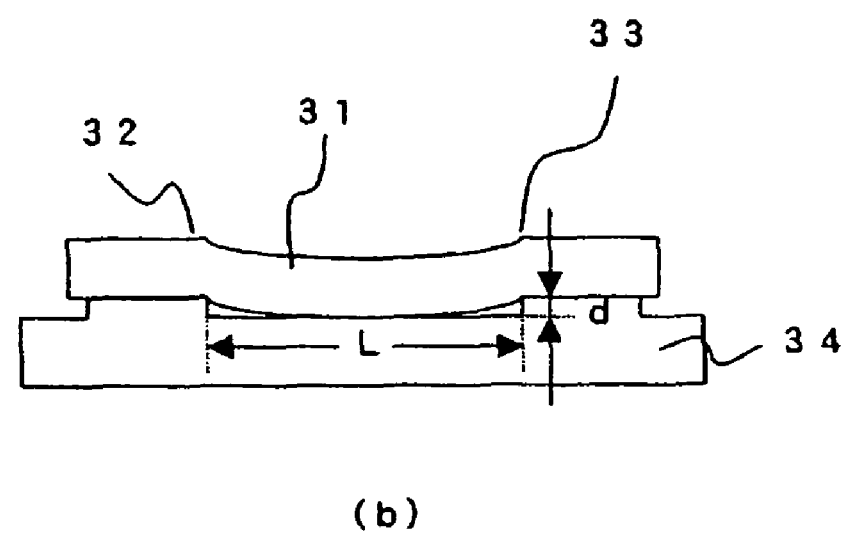

A beam structure of the present invention will be described with reference to FIG. 34. FIG. 34($a$) shows a beam before forming deflection. A beam 31$a$ has a beam length of L and fixed at fixed ends 32, 33 by a fixing member 34, and thus the beam is in the air. A shape of the beam 31$a$ may be appropriately altered in a width direction (in this figure, a depth direction to the paper) depending on a device structure as described later, and may be thus a shape where a beam width is shorter than its height or a planar shape where a beam width is considerably larger than its height. The material of the beam is a semiconductor, particularly a single crystal semiconductor. Later specific examples will be described using Si as an example, but the material of the beam is not limited to Si and any semiconductor can be used, in which carrier mobility can be improved by introducing strain (for example, SiGe, SiC, SiGeC and GaAs). The fixing member fixing both ends of the beam 31$a$ may be appropriately made of a material which can be used in a semiconductor device such as semiconductors and insulators.

A deflected beam of the present invention has a structure in which the straight beam 31$a$ in FIG. 34($a$) is deflected as shown in FIG. 34($b$). Since the deflected beam 31 as a whole is elongated in comparison with the straight beam 31$a$, a crystal lattice spacing in a beam direction is wider to introduce tensile strain in a semiconductor layer. The amount of strain introduced into the semiconductor layer depends on an elongation rate.

As shown in FIG. 34($b$), the length of an elongated beam after deflection and strain introduced can be estimated from an initial beam length L and a deflection amount d as follows, in which d is a deflection amount in the center of the beam, assuming for convenience that a deflected beam is an arc with a radius of R (>>beam height "h").

$$R = d/2 + L^2/8/d$$

Length of a deflected beam = $2R \tan^{-1}(L/2/(R-d))$

According to this model, for example, 1% strain can be realized with L=320 nm and d=20 nm, and 0.5% strain can be realized with L=460 nm and d=20 nm.

In a semiconductor device of the present invention, a deflected beam with the least deflection may be effective for introducing strain, but, for example, deflection is preferably generated such that strain is 0.1% or more, preferably 0.2% or more, further preferably 0.5% or more. The upper limit of strain applied is strain at which elastic failure occurs in a semiconductor layer and deflection can be generated within such a range. For example, a strain amount is, further depending on a cross-sectional shape of the beam, preferably 5% or less, particularly 3% or less, more particularly 2% or less in the light of avoiding elastic failure.

Such a strain amount can be accurately determined from a difference between a deflected beam length and a straight beam length L, but a ratio of L to d can be determined such that a given strain amount can be obtained according to the above-mentioned model.

When using a deflected beam as a channel region in an FET, the FET may be either a FinFET or a planar type FET. When it is a FinFET, a beam width (that is, a fin width) and a beam height h (that is, a fin height) are, but not limited to, about 5 to 100 nm and 10 to 200 nm, respectively. Absolute values of a straight beam length L and a central deflection d are determined, further taking a beam height h into account, and L is 10 nm or more, preferably 50 nm or more, further preferably 100 nm or more. Since too large L may lead to excessively large d for applying strain required, L is generally 100,000 nm or less, preferably 10,000 nm or less. Generally, d is more than 0, preferably 1 nm or more, further preferably 5 nm or more while being generally 10,000 nm or less, preferably 1,000 nm or less, further preferably 100 nm or less in the light of problems in a process. L and d are determined within these ranges to obtain a given strain amount.

When an FET is a planar type FET, a beam must have such a size that an element can be formed in its upper surface, and a beam width is 50 nm or more, preferably 100 nm or more. Since a too large beam width tends to making it difficult to form a void under the beam, the width is generally 10,000 nm or less, preferably 1,000 nm or less. A beam height h (thickness) is, for example, 10 to 200 nm. L and d may be determined substantially as in a FinFET Next, there will be described a manufacturing process according to the present invention.

A method for deflecting a beam is preferably a method where a straight beam is formed, then the beam and a void under the beam are filled with a liquid and the liquid is subsequently removed by drying. As shown in FIG. 34($a$), when forming the straight beam 31$a$, then filling the void 35 under the beam with liquid and removing the liquid by drying, surface tension of the liquid allows the beam in the beam structure to be pulled toward the bottom part of the void 35 (the side of the substrate), resulting in deflection. Furthermore, when the force is larger than a restoring force of the beam structure, the beam permanently contacts with the bottom part of the void while the beam remains deflected.

The liquid used herein may be, for example, an organic solvent, water or mercury, and water and mercury are preferable because they have a large surface tension and tend to generate deflection.

Drying in the present invention is preferably drying while keeping a surface tension as a liquid; for example, a drying process passing through a gas-liquid equilibrium curve in a substance phase diagram. Any drying method in such a type of drying method may be used; for example, spin drying, dry nitrogen blowing, heating of a wafer and drying under reduced pressure. Supercritical drying passing through a supercritical state or drying method such as lyophilization is not preferable, which does not pass through a gas-liquid equilibrium curve in a substance phase diagram. It is because a surface tension of the liquid is ineffective and thus the beam in the beam structure can not be deflected in a liquid drying process which does not pass through a gas-liquid equilibrium curve in a substance phase diagram.

Next, there will be described a specific aspect of the present invention.

Embodiment 1

Structure

Figure 1:
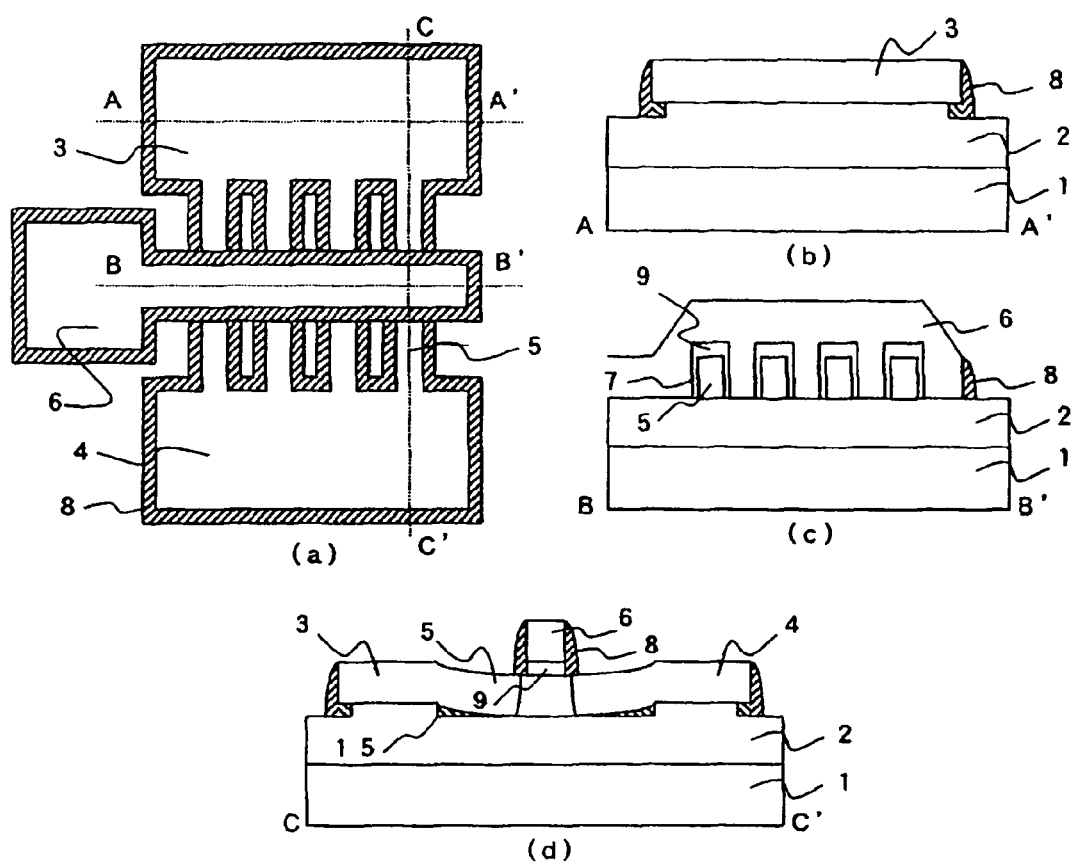
FIG. 1 shows Embodiment 1 (double-gate type FinFET).
Figure 2:
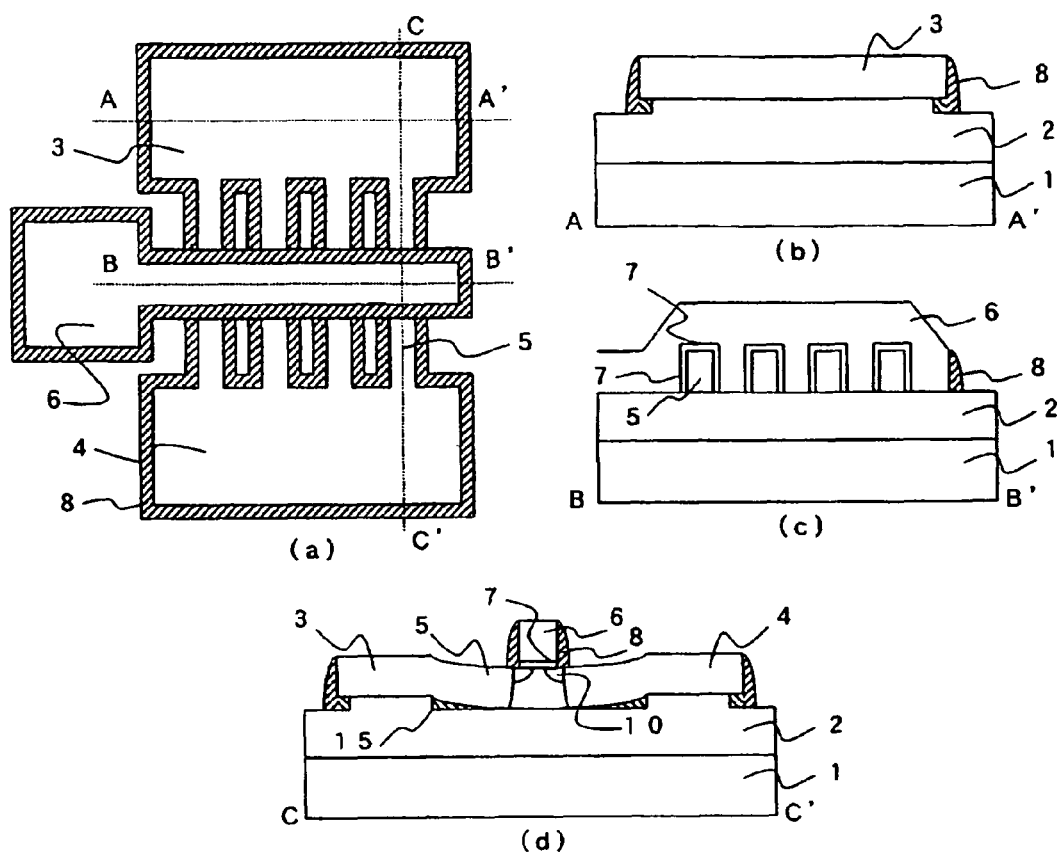
FIG. 2 shows Embodiment 1 (triple-gate type FinFET).

FIGS. 1 and 2 schematically show a structure of a semiconductor device as Embodiment 1 of the present invention. FIG. 1(*a*) is a top view, and FIGS. 1(*b*), (*c*) and (*d*) are cross-sectional views taken on lines A-A', B-B' and C-C' of FIG. 1(*a*), respectively. FIG. 2(*a*) is a top view and FIGS. 2(*b*), (*c*) and (*d*) are cross-sectional views taken on lines A-A', B-B' and C-C' of FIG. 2(*a*). FIG. 1 shows a double-gate type FinFET before forming a silicide. FIG. 2 shows a triple gate type FinFET before forming a silicide.

The semiconductor device of Embodiment 1 is a FinFET where a fin 5 has a deflected beam structure and its center is in contact with a substrate (with a buried oxide film 2) as shown in FIGS. 1(*d*) and 2(*d*).

The pads of a source electrode 3 and a drain electrode 4 at the both ends are fixed to the substrate (the buried oxide film 2) as in a conventional FinFET. For forming a state where the fin 5 is deflected to be in contact with the substrate (the buried oxide film 2), the buried oxide film 2 under the fin 5 is dug. Although there are formed spaces under the fin 5 near the pad of the source electrode 3 and under the fin 5 near the pad of the drain electrode 4 which are not present in a conventional FinFET, these are filled with an insulating film 15 under the fin.

As described later, the fin 5 is originally formed in a shape similar to that in a conventional FinFET, and then fixed in the state in contact with the substrate (the buried oxide film 2) to become a deflected shape. Microscopically, a lattice spacing in Si constituting the fin 5 is extended in the C-C' direction by deflection of the fin 5 and thus the region of the fin 5 is strained Si. It leads to improvement in carrier mobility, and therefore, the fin 5 is used as a channel in the FinFET.

Figure 29:
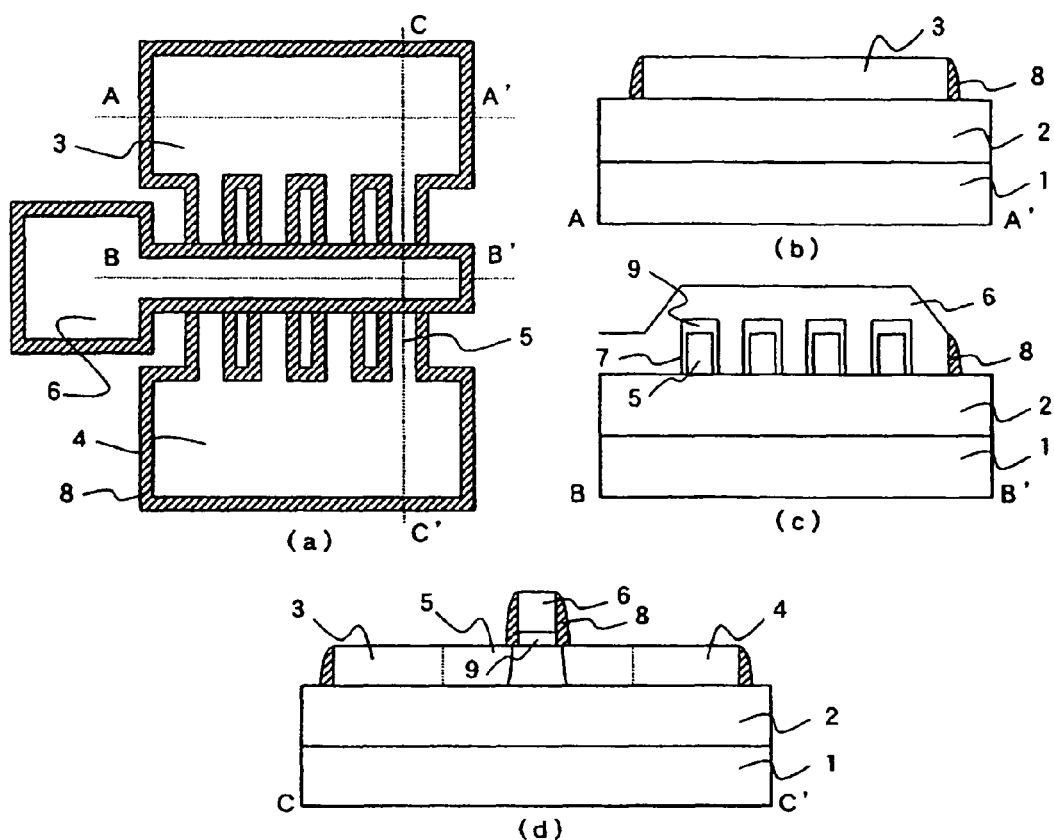
FIG. 29 shows a device structure of a conventional double-gate type FinFET.
Figure 30:
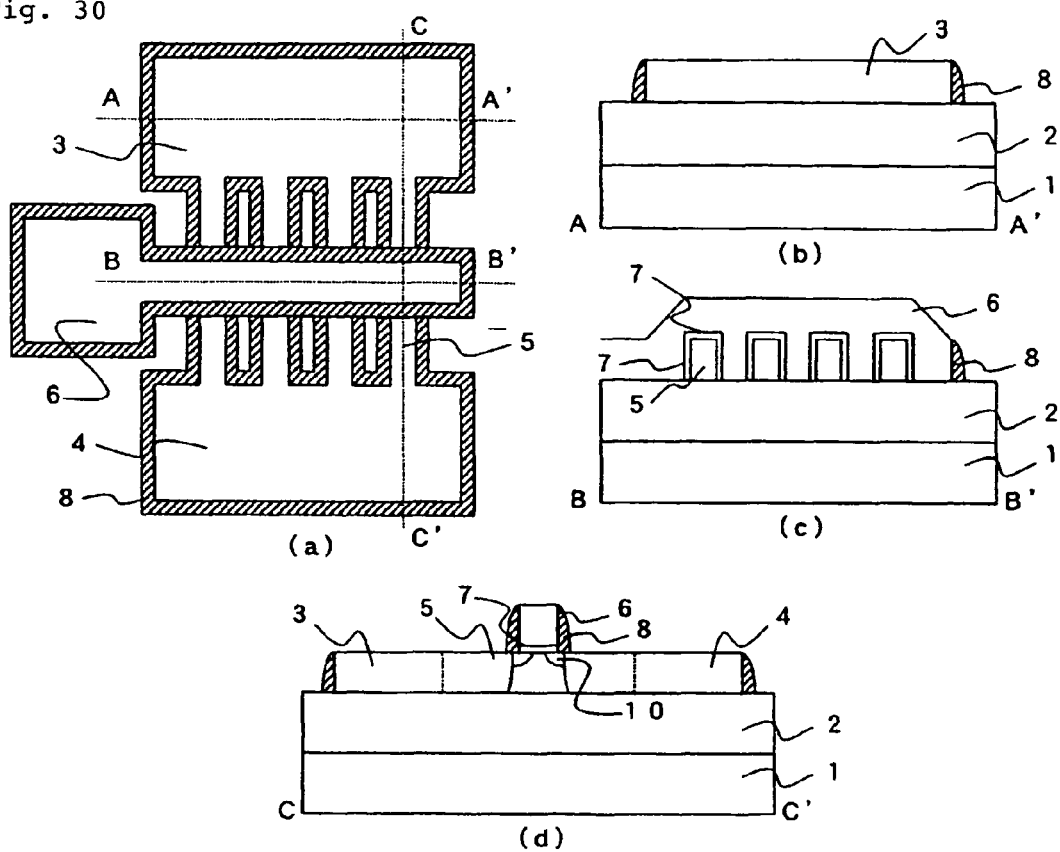
FIG. 30 shows a device structure of a conventional triple gate type FinFET.

Since this constitutes a FinFET, its basic configuration is the same as configuration in a conventional FinFET (a double-gate type is shown in FIG. 29 and a triple gate type is shown in FIG. 30). In either of FIG. 1 or FIG. 2, a FinFET is formed on an SOI substrate having the Si substrate 1, the buried oxide film 2 and an SOI layer (a layer having the source electrode 3, the drain electrode 4 and the fin 5). In the double-gate type FinFET shown in FIG. 1, a hard mask 9 is formed in the upper surface of the fin 5 and a gate insulating film 7 is formed on both side surfaces, and a gate electrode 6 is formed, surrounding these. Since the thick hard mask 9 is formed in the upper surface of the fin, the upper surface of the fin does not work as a channel. On the other hand, in the triple gate type FinFET as shown in FIG. 2, a gate insulating film 7 is formed on the upper surface and both side surfaces of the fin 5 and the gate electrode 6 is formed, surrounding them. In this triple gate type, on the upper surface of the fin, a channel is also formed.

On the side of the gate electrode 6, a sidewall is formed. The source electrode 3 and the drain electrode 4 including their pads are doped from the surface to the interface of the buried oxide film 2 or the lower part of the fin into an n-type in an n-type FinFET or a p-type in a p-type FinFET, to be deep electrodes. The source electrode 3 and the drain electrode 4 are connected to an extension with a smaller junction depth and the same doping type. There may be formed, near the extension, a halo with a conduction type different from that of the extension (not shown). A channel is generally doped into a p-type in an n-type FinFET and an n-type in a p-type FinFET, but it may be used as an i-type without being doped.

Manufacturing Process

There will be described a manufacturing process of Embodiment 1 with reference to FIGS. 1 to 10. With reference to FIGS. 3 to 10, there will be described a manufacturing process for a triple gate type FinFET (FIG. 2) which is the same manufacturing process as a double-gate type FinFET (FIG. 1) except some elements. The difference will be described later.

For manufacturing the semiconductor device of this embodiment, as in the conventional art, a base is an SOI substrate having a Si substrate 1, a buried oxide film 2 and an SOI layer (a layer having a source electrode 3, a drain electrode 4 and a fin 5). A thickness of the SOI layer in the substrate is determined, taking into account a loss in the resist removal steps and the sacrifice oxidation steps in the process described later. For example, when a final fin height is 40 nm, an SOI substrate having an SOI layer with a thickness of 50 nm is used.

First, channel implantation is carried out as follows. On an SOI layer is formed a sacrifice oxidation film for channel implantation to 16 nm by, for example, wet oxidation. Then, lithography is executed and a p-type dopant is ion-implanted in a region to be an n-type FinFET For example, monovalent boron is ion-implanted at an acceleration energy of 12 keV and a dosage of $8\times10^{12}$ cm$^{-2}$. After ion implantation of the p-type dopant, the resist is removed. Then, lithography is conducted and an n-type dopant is ion-implanted in a region to be a p-type FinFET For example, monovalent phsphorous is ion-implanted at an acceleration energy of 33 keV and a dosage of $3\times10^{12}$ cm$^{-2}$. After ion implantation of the n-type dopant, the resist is removed. After channel implantation, the sacrifice oxidation film is removed.

Figure 3:
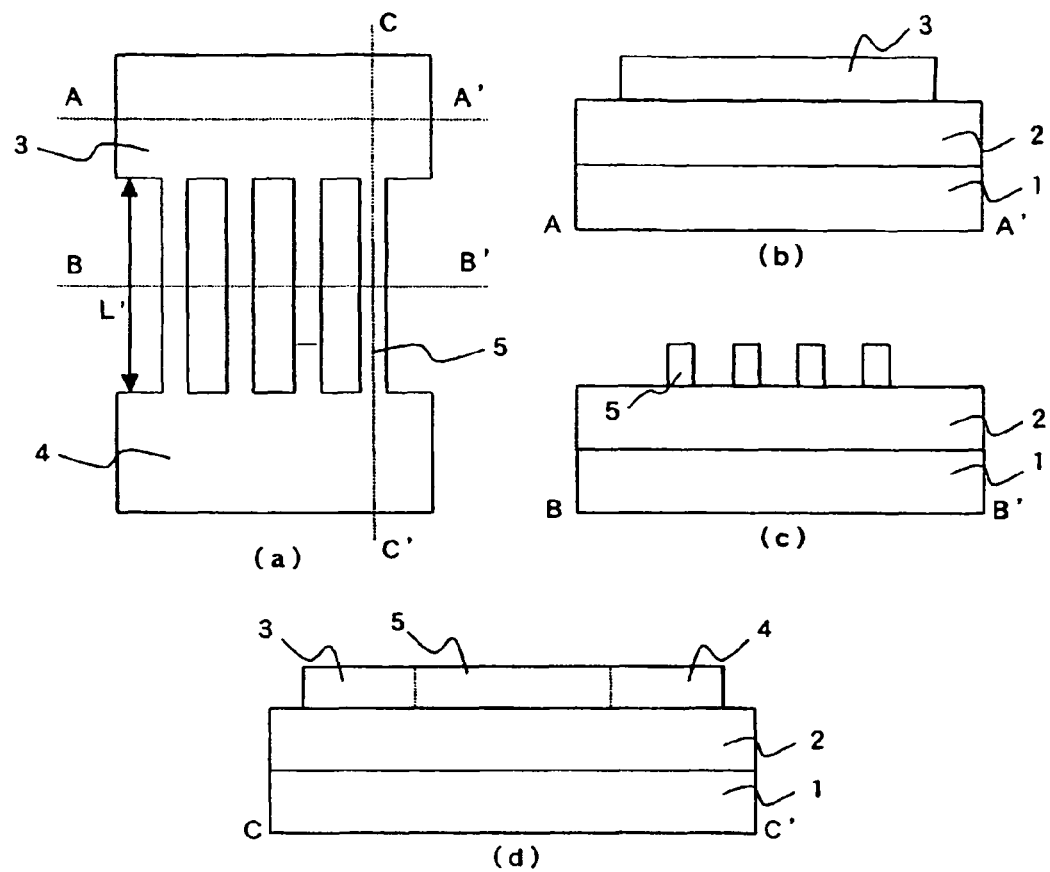
FIG. 3 is a process drawing illustrating a structure of Embodiment 1 in the course of production (after forming a fin and an electrode pad).

Next, as shown in FIG. 3, lithography and dry etching are carried out to form a pattern of a pad of the source electrode 3, a pad of the drain electrode 4 and the fin 5 in the SOI layer. After etching, the resist is removed.

Figure 4:
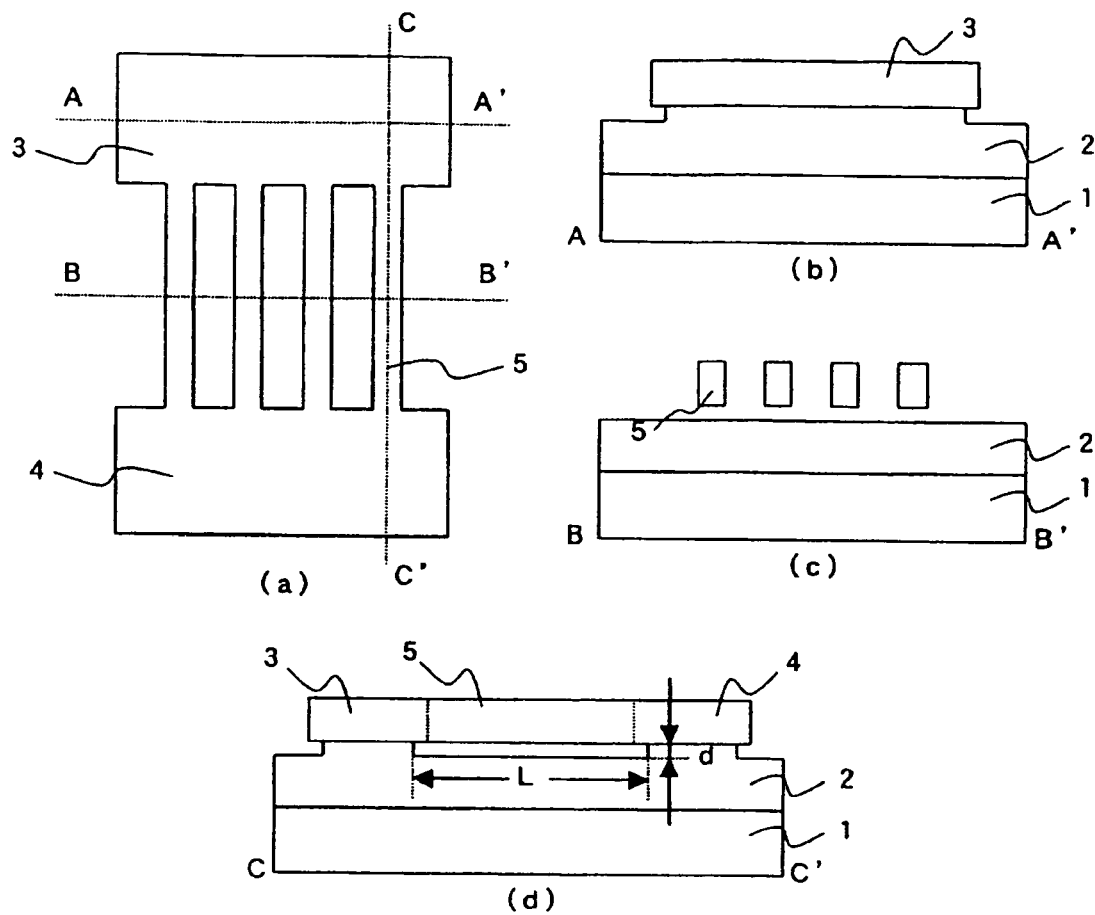
FIG. 4 is a process drawing illustrating a structure of Embodiment 1 in the course of production (after etching a buried oxide film).

Then, as shown in FIG. 4, the buried oxide film 2 is isotropically etched under the conditions where a selection ratio to Si in etching is large. An example is etching with hydrofluoric acid. Herein, while undercut proceeds under the pattern, a void is formed under the fin because of a smaller width of the fin, so that the fin is in the air (FIGS. 4(*c*) and (*d*)), to form a beam structure. On the other hand, since the pad of the source electrode 3 and the pad of the drain electrode 4 are large in size, they remain to be fixed on the substrate (the buried oxide film 2) while undercut proceeds under them. In other words, etching by undercut can be executed to be equal to or more a half of the width of the fin 5, so that the fin 5 can be in the air to form a beam structure. Here, a beam length is L and a void depth under the beam is d.

Figure 5:
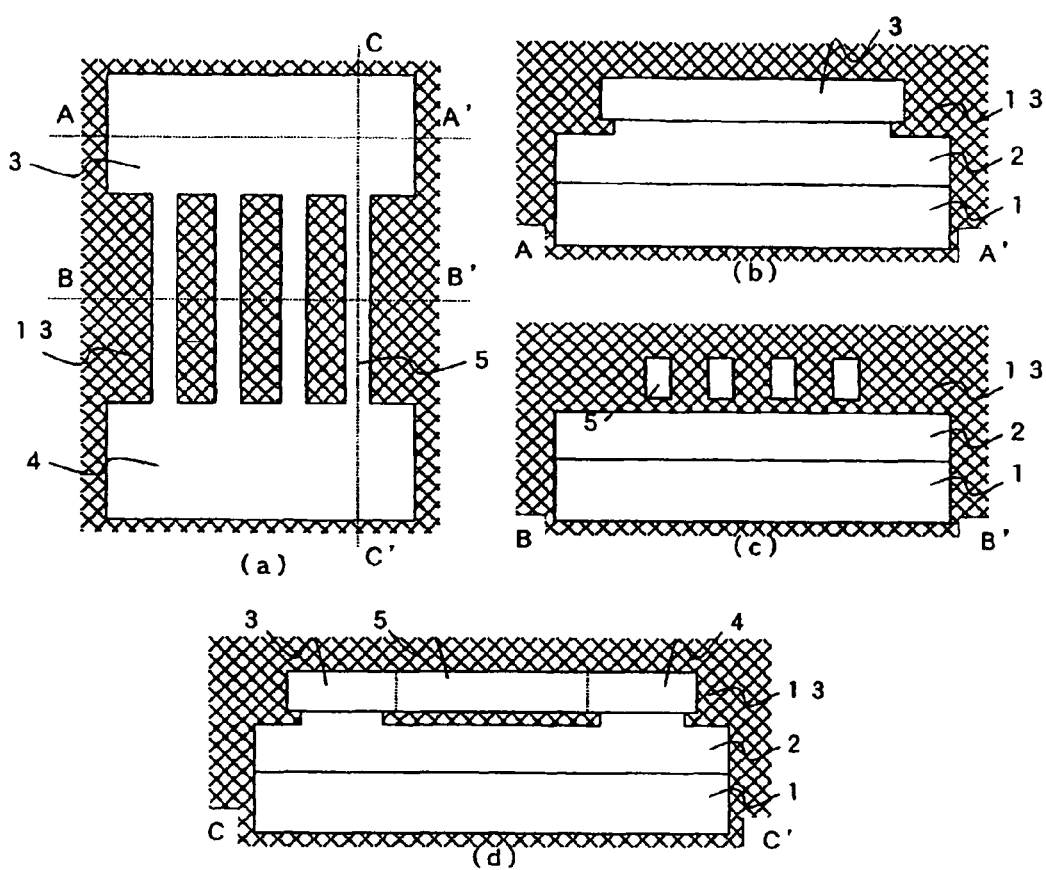
FIG. 5 is a process drawing illustrating a structure of Embodiment 1 in the course of production (during immersion in a liquid).

Then, as shown in FIG. 5, the fin 5 having the beam structure is immersed in a liquid 13. When using, for example, water as the liquid 13, after the etching with hydrofluoric acid in FIG. 4, the wafer is immersed into water while hydrofluoric acid remains on the wafer, to thoroughly replace the liquid on the wafer with water.

Figure 6:
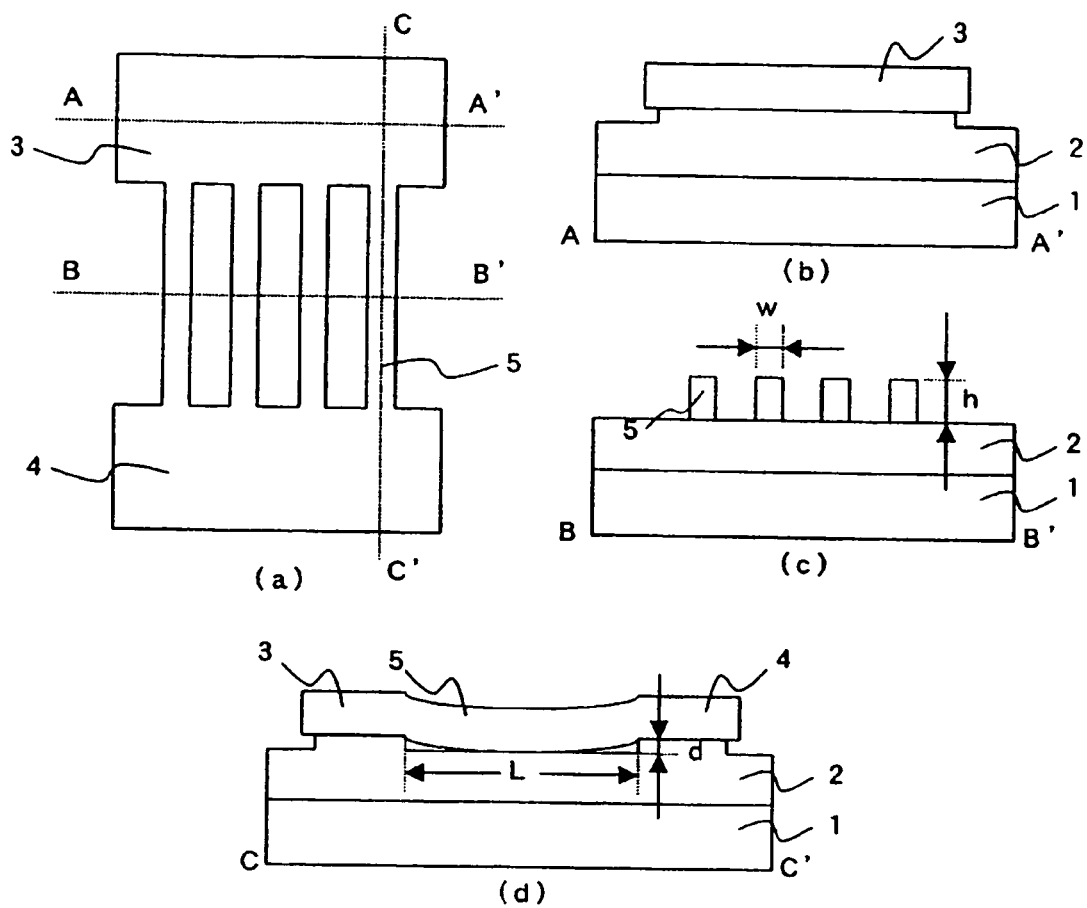
FIG. 6 is a process drawing illustrating a structure of Embodiment 1 in the course of production (after removing a liquid by drying).

Then, the liquid 13 is removed by drying (FIG. 6). Here, the fin 5 is pulled toward the lower part direction of the substrate by a surface tension of the liquid, and when the force is larger than a restoring force of the fin 5, the fin 5 is in contact with the substrate (the buried oxide film 2) with the fin 5 deflecting. Even after complete removal of the liquid, the deflected fin 5 remains in the state by an adherence of the substrate surface.

Such a phenomenon is called sticking phenomenon (adherence phenomenon), and well-known in the field of micromachines (for example, Masayoshi Esashi ed., "Micromachine—a small and high-performance system in which various elements are integrated", Industrial Technology Service Center, Feb. 18, 2002, pp. 221-230, Jiro Sakata "Section 3: Measures to Sticking"). However, in the field of micromachines, once an originally movable portion is fixed on the substrate by adhesion, it becomes useless as a machine, and therefore, sticking phenomenon (adherence phenomenon) is generally a problematic phenomenon and some treatment is conducted to avoid this phenomenon.

In the manufacturing process of the present invention, this sticking phenomenon (adherence phenomenon) is willingly used to deflect the fin. Microscopically, a lattice spacing of Si in a C-C' direction is expanded to give a strained Si. The present invention is most markedly characterized in that a strained Si thus formed is used for, for example, a channel in an FET.

Drying can be carried out, as described above, by any drying method which passes through a gas-liquid equilibrium curve in a substance phase diagram, such as spin drying, dry nitrogen blowing, wafer heating and drying under reduced pressure.

Although water has been used as an example of the liquid 13, it may be possible to use a liquid having a larger surface tension than water for easier deflection. However, such a liquid is limited to mercury, which must be deliberately handled in the light of safety to the human body.

Figure 7:
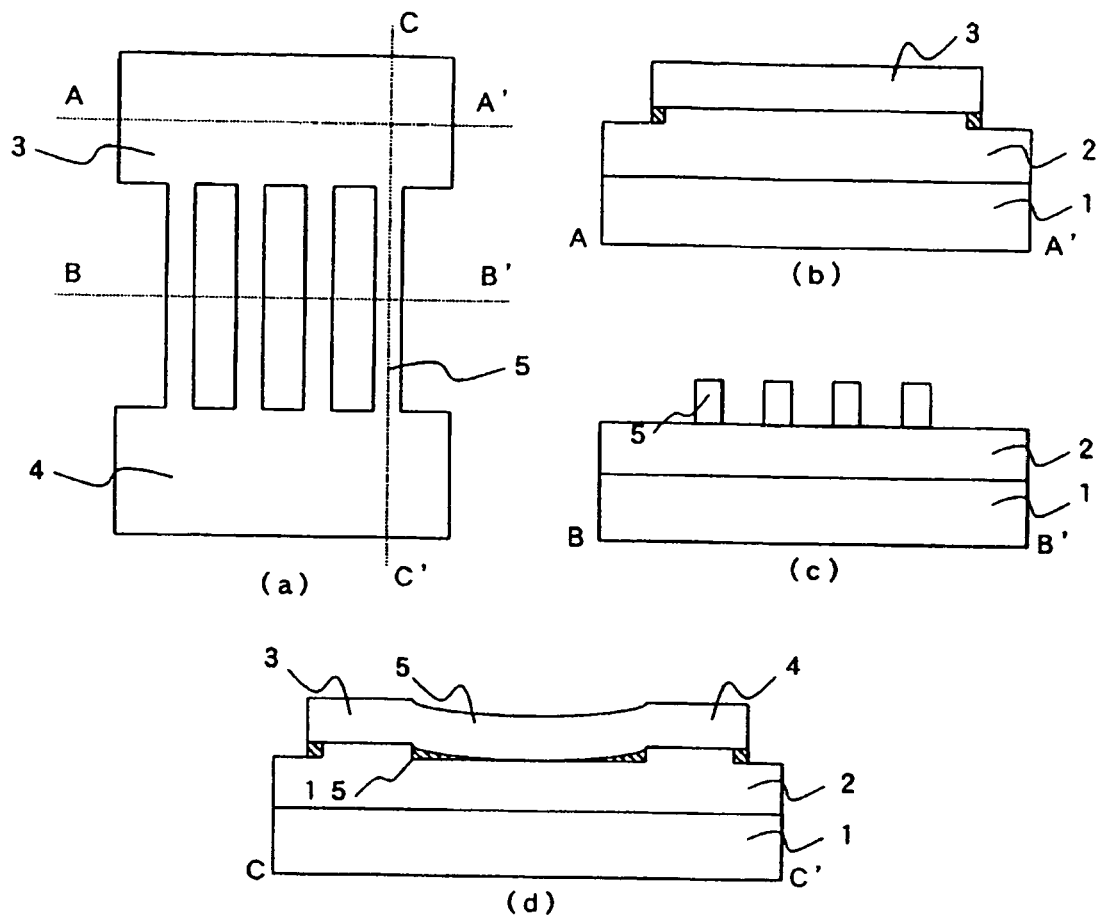
FIG. 7 is a process drawing illustrating a structure of Embodiment 1 in the course of production (after filling a void under a fin with an insulating film).

After applying strain to the fin 5, the space under the fin 5 is filled with an insulating film 15 (FIG. 7). For example, a thin oxide film is formed to 2 nm (not shown), and then $Si_3N_4$ is deposited to 60 nm. Here, $Si_3N_4$ is deposited by CVD (Chemical Vapor Deposition), such that the space under the fin is also filled with the insulating film. Then, $Si_3N_4$ is etched back. After the etching back, the etching task is stopped at the time when $Si_3N_4$ except that under the fin 5 has been removed, and the oxide film on the upper surface and both side surfaces of the fin 5 is removed. The insulating film under the fin 5 may be a monolayer $SiO_2$ or a monolayer $Si_3N_4$.

Figure 8:
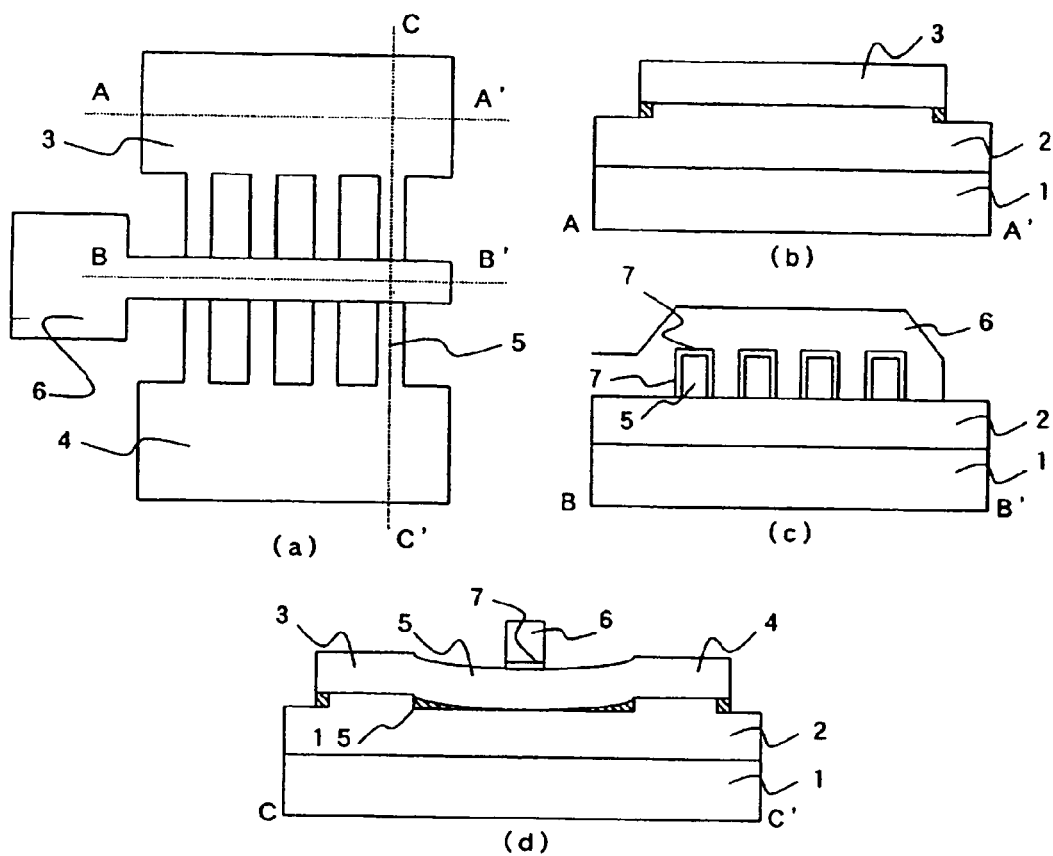
FIG. 8 is a process drawing illustrating a structure of Embodiment 1 in the course of production (after removing a gate insulating film except that under a gate electrode).

Subsequently, as a gate insulating film 7, for example, an oxide film is formed to 1.8 nm. The gate insulating film 7 may be, in addition to an oxide film and an oxynitride film, a so-called High-K film such as $Ta_2O_5$, $Al_2O_3$, $HfO_2$, $ZrO_2$, ZrON, HfON, HfAlON and HfSiON. After forming the gate insulating film 7, a gate electrode material (for example, 100 nm of poly-Si) is deposited and then lithography and etching are executed to form a gate electrode 6. A gate electrode material may be, in addition to poly-Si and poly-SiGe, a metal such as TaN, TiN, W and WN or NiSi in which poly-Si is completely silicided. Alternatively, a gate structure may be used, in which combined materials are stacked, such as a metal stack gate and a stacked gate of poly-Si and a metal. After forming the gate electrode 6, the resist is removed and then the gate insulating film 7 except that under the gate electrode 6 is removed (FIG. 8).

Figure 9:
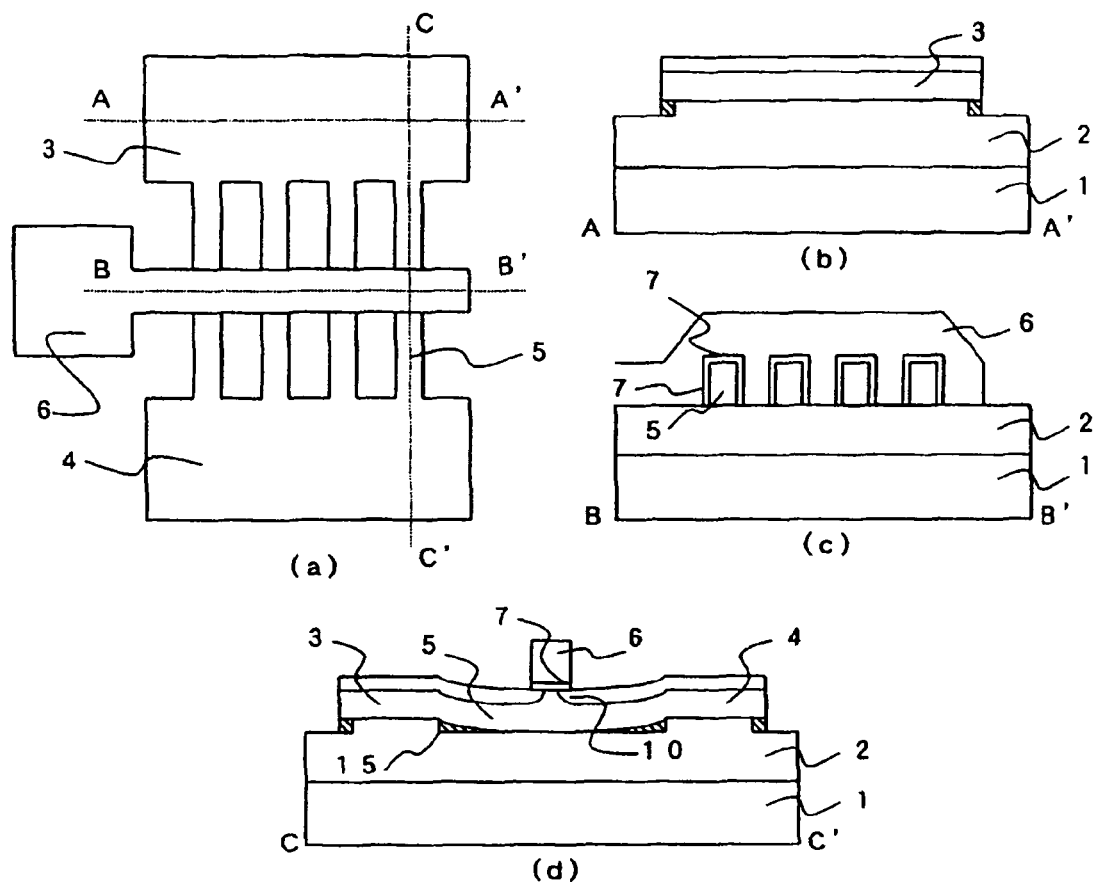
FIG. 9 is a process drawing illustrating a structure of Embodiment 1 in the course of production (after ion implantation for forming an extension).

Then, as shown in FIG. 9, extension implantation is conducted to form an extension region 10 in the side surface and the upper surface of the Fin. For extension implantation, lithography is executed and an n-type dopant is ion-implanted in the region to be an n-type FinFET. For example, monovalent arsenic is ion-implanted at an acceleration energy of 2.5 keV and a dosage of $5 \times 10^{14}$ cm$^{-2}$. Here, ion implantation is carried out twice at an angle of 45° such that ions are implanted to both side surfaces of the fin 5. After ion implantation of the n-type dopant, the resist is removed. Then, lithography is conducted and a p-type dopant is ion-implanted in the region to be a p-type FinFET. For example, monovalent $BF_2$ is ion-implanted at an acceleration energy of 3.5 keV and a dosage of $6 \times 10^{14}$ cm$^{-2}$. Again, ion implantation is carried out twice at an angle of 45° such that ions are implanted to both side surfaces of the fin 5. After ion implantation of the p-type dopant, the resist is removed.

Figure 10:
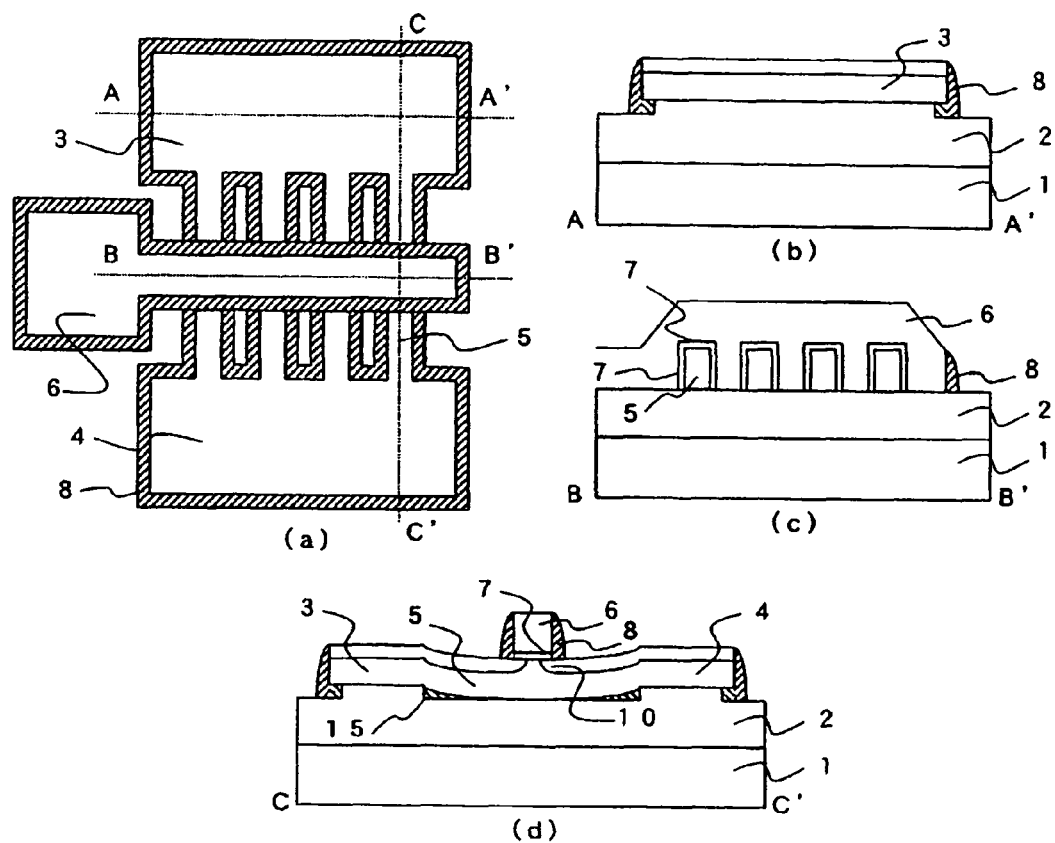
FIG. 10 is a process drawing illustrating a structure of Embodiment 1 in the course of production (after forming a sidewall).

Then, first, a material to be a sidewall insulating film, for example, $Si_3N_4$ is deposited to 50 nm and etched back to form a sidewall insulating film 8 (FIG. 10). The sidewall insulating film may be made of $SiO_2$, or alternatively, a plurality of layers such as a lower layer of $SiO_2$ to 10 nm and an upper layer of $Si_3N_4$ to 50 nm may be deposited and then etched back to form a multilayer structure of sidewall.

Then, ion implantation is executed to form a deep electrode (a source electrode and a drain electrode). For the purpose of this, first, lithography is conducted and an n-type dopant is ion-implanted in the region to be an n-type FinFET. For example, monovalent arsenic is ion-implanted at an acceleration energy of 8 keV and a dosage of $5 \times 10^{14}$ cm$^{-2}$ and then monovalent phosphorous is ion-implanted at an acceleration energy of 5 keV and a dosage of $4 \times 10^{15}$ cm$^{-2}$. After the ion implantation of the n-type dopant, the resist is removed. Then, lithography is carried out and a p-type dopant is ion-implanted in the region to be a p-type FinFET. For example, monovalent boron is ion-implanted at an acceleration energy of 2 keV and a dosage of $3 \times 10^{15}$ cm$^{-2}$. After the ion implantation of the p-type dopant, the resist is removed. Then, activated annealing (for example, spike annealing at 1055° C. for 0 sec) is executed. Thus, the structure of FIG. 2 is formed.

Subsequently, a silicide step is conducted. For example, $CoSi_2$ is formed as a silicide. The silicide may be, in addition, NiSi, $TiSi_2$, $CoSi_2$, NiSi, PtSi or $Pd_2Si$. Finally, an inter-layer insulating film is deposited, lithography and etching are conducted, a contact hole is formed and then the hole is filled with a metal to form a contact (not shown). A metal used for the contact may be selected from W, Al, TiN, Ti and their stacked films.

Although not being used in the above description, Si may be selectively grown after forming the sidewall (after FIG. 10) to form an elevated structure of the source electrode 3 and the drain electrode 4. For example, Si is selectively grown to about 30 nm by repeating the cycle of $Si_2H_6$ at a flow rate of 24 sccm for 10 sec at a substrate temperature of 640° C. and $Cl_2$ at a flow rate of 1 sccm for 60 sec. After the selective growth of Si, ion implantation is carried out to form a deep electrode.

In a double-gate type FinFET (FIG. 1), channel implantation is conducted, a sacrifice oxidation film is removed and then a hard mask 9 is formed on a substrate. Then, lithography and dry etching are executed to print the pattern of a pad of the source electrode 3, a pad of the drain electrode 4 and the fin 5 formed by lithography to the hard mask 9. After removing the resist, the SOI layer is etched using the hard mask 9 as a mask.

The subsequent process is the same as process in a triple gate type FinFET. However, in a double-gate type FinFET, although an extension implantation is carried out, extension is not formed in the upper surface of the fin 5 except a part in contact with the side surface because the hard mask 9 is present on the upper surface of the fin 5.

In this embodiment, a strain amount is controlled as follows. As shown in FIG. 6, an etching depth of the buried oxide film is defined as d, and a fin length before forming deflection is defined as L. L is the sum of the fin length L' in FIG. 3, an undercut length under the pad of the source electrode and an undercut length under the pad of the drain electrode (FIG. 4), and when etching in FIG. 4 is isotropic, an undercut length is equal to the etching depth d of the buried oxide film. That is, $L=L'+2d$. Assuming that only the center of the fin 5 is in contact with the buried oxide film 2 and the deflected fin part is circular with a radius R (>>a fin height h), $R=d/2+L^2/8/d$ as described above and a length of the circular fin part is represented by $2R \tan^{-1}(L/2/(R-d))$, and thus 1% strain can achieved when L=320 nm, d=20 nm and 0.5% strain can achieved when L=460 nm, d=20 nm. Thus, in the present invention, a strain amount can be easily controlled by controlling a beam length L (or L' before etching) and an etching depth d.

Modification of Embodiment 1

In the process of the present invention, different strain can be applied to each FinFET constituting an integrated circuit. For example, when a certain FinFET is to be used as a conventional FinFET without strain, the FinFET can be masked after the process of FIG. 3, not to be etched during the buried oxide film etching in FIG. 4. Since the strain amount can be controlled by L and d as described above, under a constant d condition, strain can be controlled by altering L for each FinFET. Under a constant L condition, the amount of buried oxide film etching d is altered for each FinFET. That is, buried oxide film etching is conducted more than once appropriately in combination with masking of a FinFET, to apply different strain to each FinFET. These methods can be combined.

For example, a triple gate type FinFET is layouted such that the Fin in parallel to the X-axis using a (100) SOI wafer and keeping a <110> notch down. Here, the upper surface of the Fin is a (100) plane while the side surface of the Fin is a (110) plane. Generally, in a (110) plane, electron mobility is reduced while hole mobility is increased, so that in comparison with a triple gate type FinFET in which the side surface of the Fin is also a (100) plane, an ON current obtained in an n-type FinFET is decreased and an ON current obtained in a p-type FinFET is increased. Here, when the present invention is applied to only an n-type FinFET while a p-type FinFET is of a conventional type, strain effects allow electron mobility to increase, so that a current reduction in an n-type FinFET can be adequately compensated and resultantly a high-performance element can be obtained in either an n-type FinFET or p-type FinFET.

In the present invention, a fin material is not limited to Si, but other semiconductor materials may be used. For example, by using an SGOI substrate as a film with no defects for conducting the above process of the present invention, a strain FinFET in which a channel material is SiGe can be provided.

Embodiment 2

There will be described Embodiment 2 of the present invention with reference to the drawings.

Figure 11:
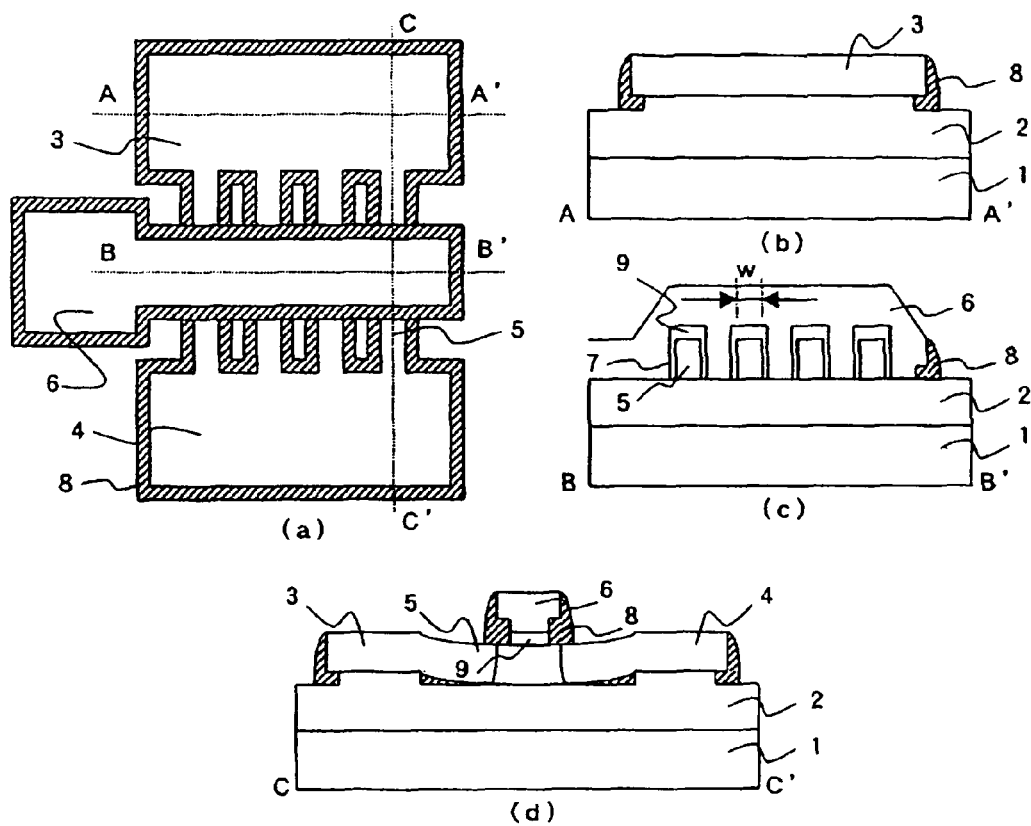
FIG. 11 shows Embodiment 2 (double-gate type FinFET).
Figure 12:
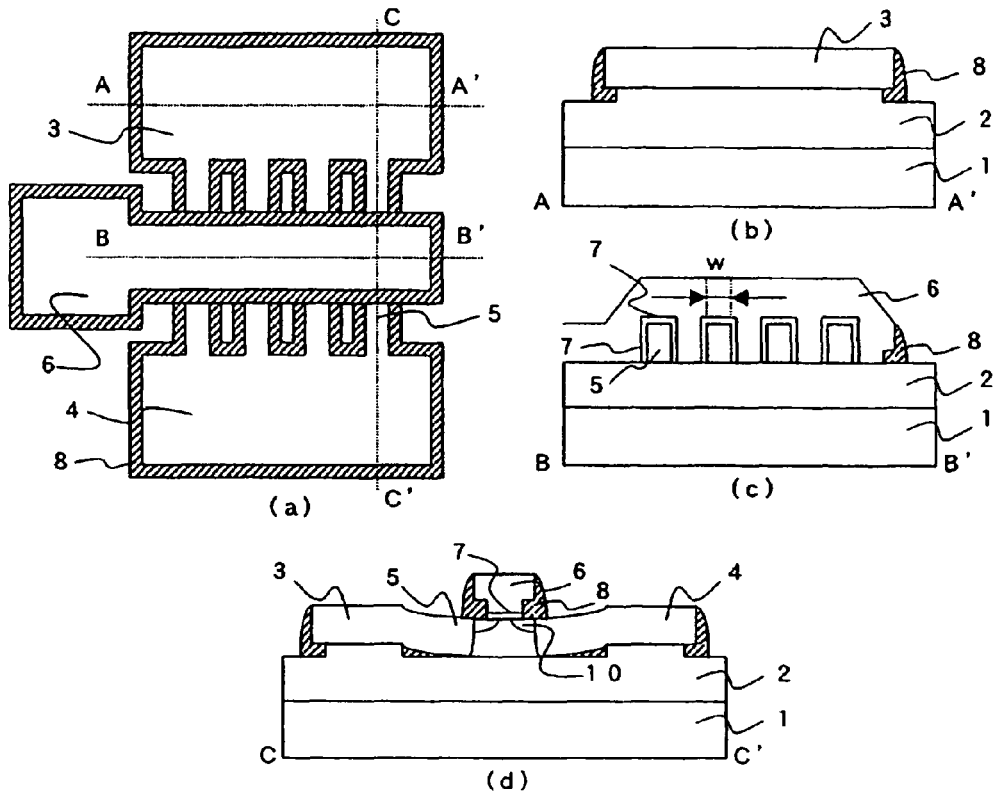
FIG. 12 shows Embodiment 2 (triple gate type FinFET).

FIGS. 11 and 12 schematically show Embodiment 2 of a semiconductor device of the present invention. FIG. 11(a) is a top view, and FIGS. 11(b), (c) and (d) are cross-sectional views taken on lines A-A', B-B' and C-C' of FIG. 11(a), respectively. FIG. 12(a) is a top view, and FIGS. 12(b), (c) and (d) are cross-sectional views taken on lines A-A', B-B' and C-C' of FIG. 12(a). FIG. 11 shows a double-gate type FinFET before forming a silicide. FIG. 12 shows a triple gate type FinFET before forming a silicide.

Embodiment 2 employs a manufacturing process different from that in Embodiment 1, in which steps are reduced. Reflecting the difference, the structures are partly different. Specific differences are a shape of the gate electrode 6 and an insulating film under the fin 5. The gate electrode 6 in Embodiment 2 has a so-called notch type gate shape where a region in contact with the gate insulating film 7 is shorter than the length of the upper part of the gate. Since etching for forming such a notch type gate shape is used, there is a limitation that a fin width w must be not more than a two-fold of the notch width (the reason will be described later). The gate electrode material is also preferably a material by which a notch type gate can be easily formed (for example, poly-Si). In Embodiment 2, since the insulating film under the fin is formed concomitantly with the sidewall insulating film 8, the insulating film under the fin is necessarily made of the same material as the sidewall insulating film 8. The structure of the other part is the same as the structure in Embodiment 1.

There will be described a process for manufacturing in Embodiment 2 with reference to FIGS. 3 to 6 and 12 to 15. First, there will be described a process for manufacturing a triple gate type FinFET (FIG. 12), which is similar to that for a double-gate type FinFET (FIG. 11) except some elements. The difference will be described later.

In Embodiment 2, first a sequence of processes for channel implantation are carried out as described in Embodiment 1, then as described in Embodiment 1 with reference to FIGS. 3 to 6, a pattern of a pad of the source electrode 3, a pad of the drain electrode 4 and the fin 5 is formed (FIG. 3), the fin 5 is formed in a beam structure (FIG. 4), the void under the fin is filled with a liquid (FIG. 5) and the liquid is removed by drying to deflect the fin 5 (FIG. 6). Then, the space under the fin 5 is filled with an insulating film in Embodiment 1 (FIG. 7), while in Embodiment 2, the fin 5 is deflected, then a gate insulating film 7 is formed and a material for a gate electrode is deposited. Thus, the space under the fin is also filled with the material for a gate electrode. Subsequently, lithography and gate etching are executed to form a gate electrode, where etching is conducted such that a notch type gate shape is formed.

Etching for forming a notch type gate shape is described in, for example, Journal of Vacuum Science and Technology, P.2024-2031, VOL.B20, NO. 5, September/October, 2002. First, after etching a native oxide film, etching is anisotropically carried out under the conditions where a sidewall protecting layer is formed, to etch about a half to ⅓ of the gate electrode layer. Then, the etching conditions are changed to those where etching anisotropically proceeds without forming a sidewall protecting layer and the etching is continued. The etching conditions are changed immediately before etching reaches the gate insulating film, to ensure to stop the etching at the gate insulating film. Then, the lower part of the gate electrode without a sidewall protecting layer is laterally etched by changing the etching conditions. A series of such etching processes can be sequentially conducted to form a notch type gate shape.

Basically, since the etching processes are sequentially executed varying a gas, a power and a pressure, these can be continuously conducted in one chamber. For example, when etching a poly-Si gate electrode layer, etching is carried out using a $CF_4/Al$ system which can etch a native oxide film, and then anisotropic etching is conducted while a sidewall protecting layer is formed under the conditions of a HBr/Cl$_2$ system plus O$_2$. Subsequently, a gas system is changed to Cl$_2$ containing SF$_6$; etching of the gate electrode layer is continued under the conditions where a sidewall protecting layer is not formed; again the conditions are changed to a HBr/Cl$_2$ system plus O$_2$, and etching is continued to a gate insulating film. Then, after changing the conditions to HBr plus O$_2$, the lower part of the gate electrode without a sidewall protecting layer is laterally over-etched. Thus, etching can be continually executed while changing the etching conditions, to form a notch type gate shape in which the lower part of the gate is smaller than the upper part.

In an etching process for forming a notch type gate shape, etching of the gate electrode material reaches the buried oxide film 2 and then the etching laterally proceeds. Here, while the region in the gate electrode 6 in contact with the gate insulating film 7 becomes smaller, the gate electrode material under the fin 5 is simultaneously etched off by lateral etching.

That is, since the space under the fin 5 is not filled with an insulating film before forming the gate electrode in Embodiment 2, the gate electrode material filling the space under the fin must be removed. Therefore, after forming the gate electrode in a common shape, etching must be conducted such that the etching proceeds laterally. Thus, an etching process whereby a notch type gate shape is formed is employed.

In Embodiment 2, a notch width (the amount laterally etched) cannot be increased with no restriction, but since the width of one side is generally about 10 nm to 30 nm, the fin width w is limited to 2-fold or less of the one-side notch width (for example, when a notch width is 20 nm, a fin width is 25 nm (<20 nm×2).). Without meeting the conditions, the gate electrode material under the fin 5 is not removed.

Figure 13:
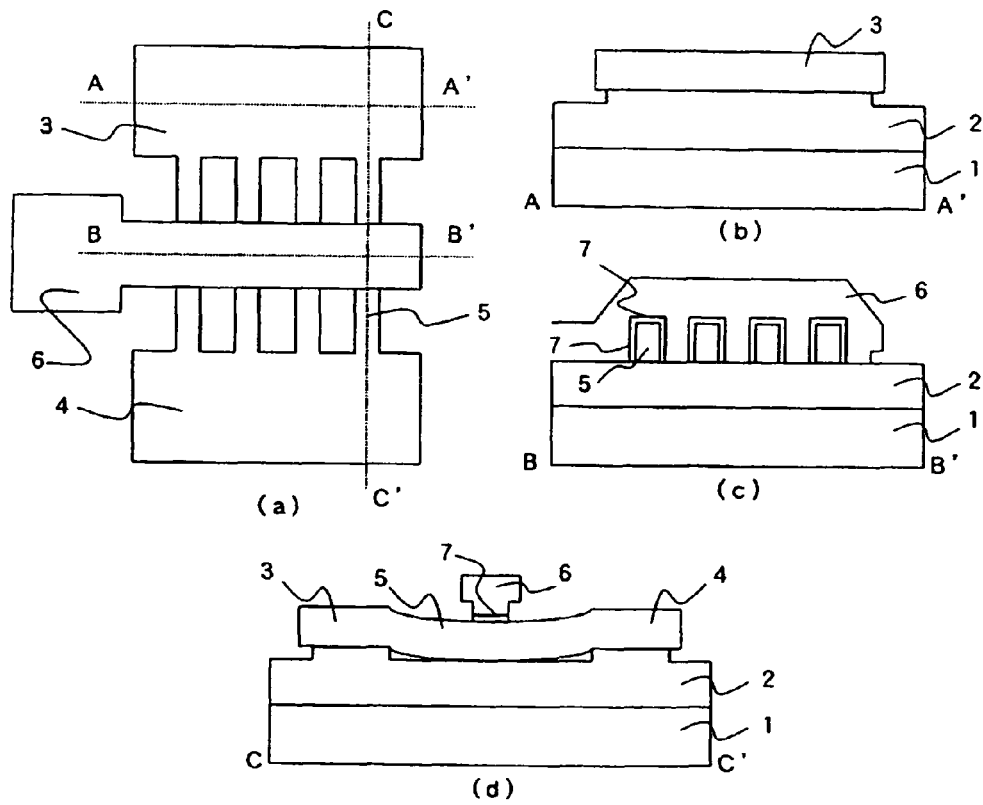
FIG. 13 is a process drawing illustrating a structure of Embodiment 2 in the course of production (after removing a gate insulating film except that under a gate electrode).
Figure 14:
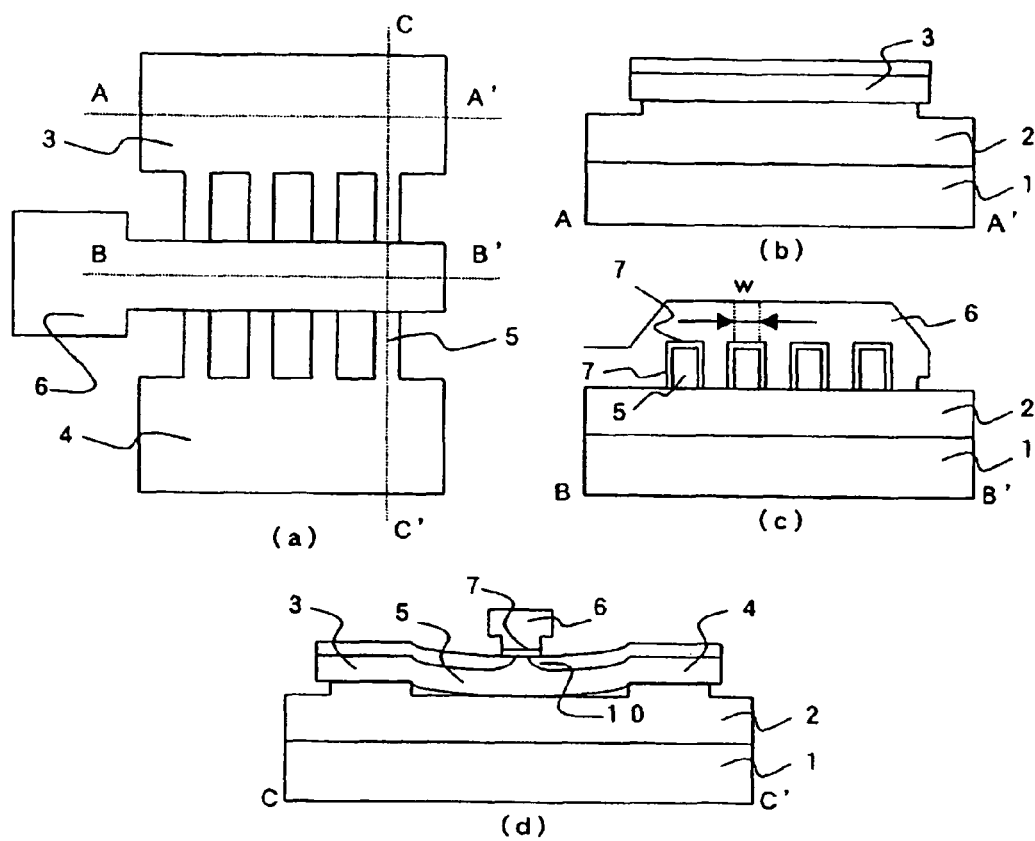
FIG. 14 is a process drawing illustrating a structure of Embodiment 2 in the course of production (after ion implantation for forming an extension).
Figure 15:
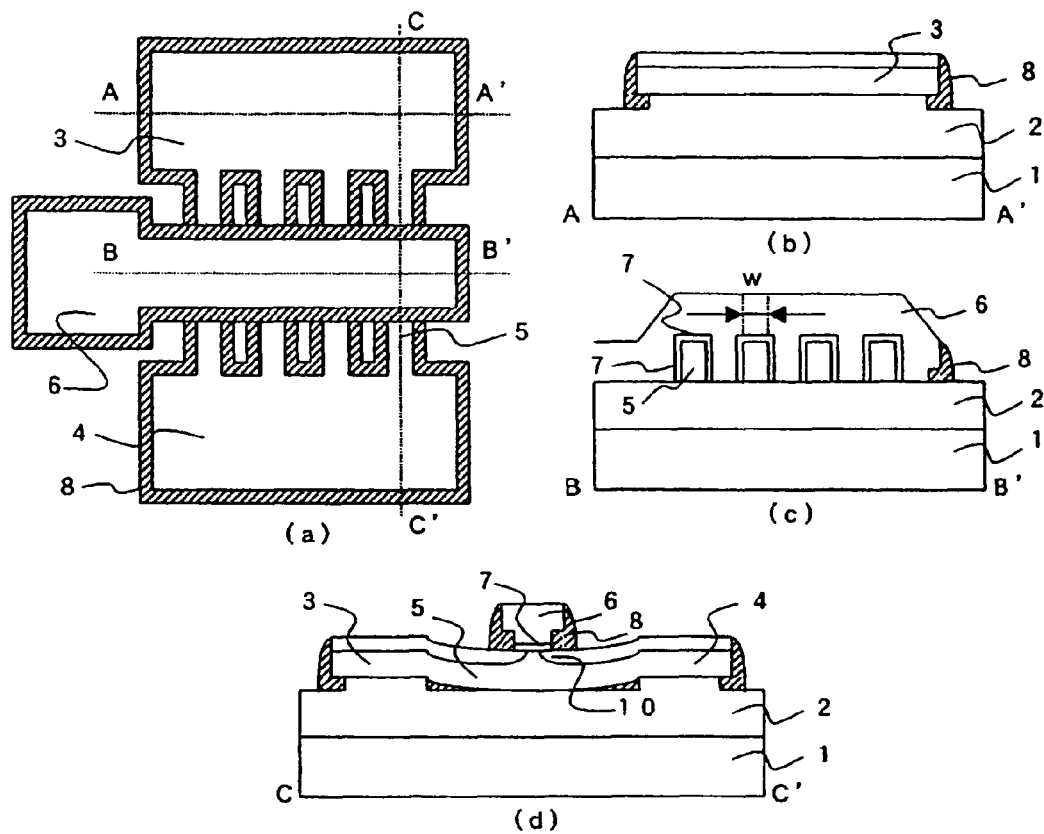
FIG. 15 is a process drawing illustrating a structure of Embodiment 2 in the course of production (after forming a sidewall).

After etching the gate, the gate insulating film 7 except that under the gate electrode 6 is removed (FIG. 13). Then, extension implantation is carried out (FIG. 14), and an insulating film to be a sidewall is deposited. Then, it is etched back to form a sidewall. Here, in this embodiment, the space under the fin can be simultaneously filled with the sidewall insulating film (FIG. 15).

The subsequent process is the same process as in Embodiment 1. That is, if necessary, selective growth of Si is executed, lithography for forming a deep electrode is conducted, ion implantation is carried out and after the implantation, the resist is removed. Then, activated annealing is conducted. Thus, the state shown in FIG. 12 is obtained. Further, a silicide is formed, an inter-layer insulating film is deposited, lithography is executed, a contact hole is formed and the resist is removed. Then, a contact is formed.

Difference in a process between the double-gate type FinFET and the triple gate type FinFET is the same Difference as in Embodiment 1. There are no particular differences in this embodiment.

As described above, this embodiment is advantageous in comparison with Embodiment 1, in that a process is shortened in terms of the step of forming an insulating film under the fin (FIG. 7).

Embodiment 3

Next, there will be described Embodiment 3 of the present invention with reference to the drawings.

Figure 16:
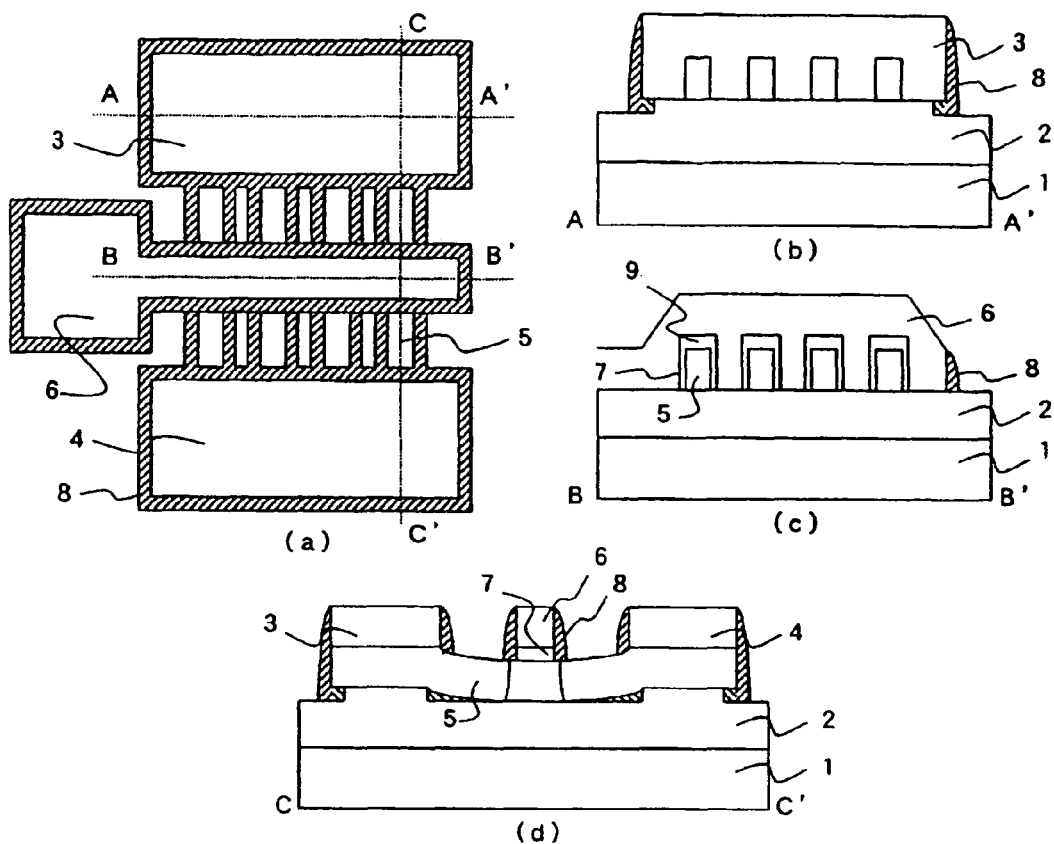
FIG. 16 shows Embodiment 3 (double-gate type FinFET).
Figure 17:
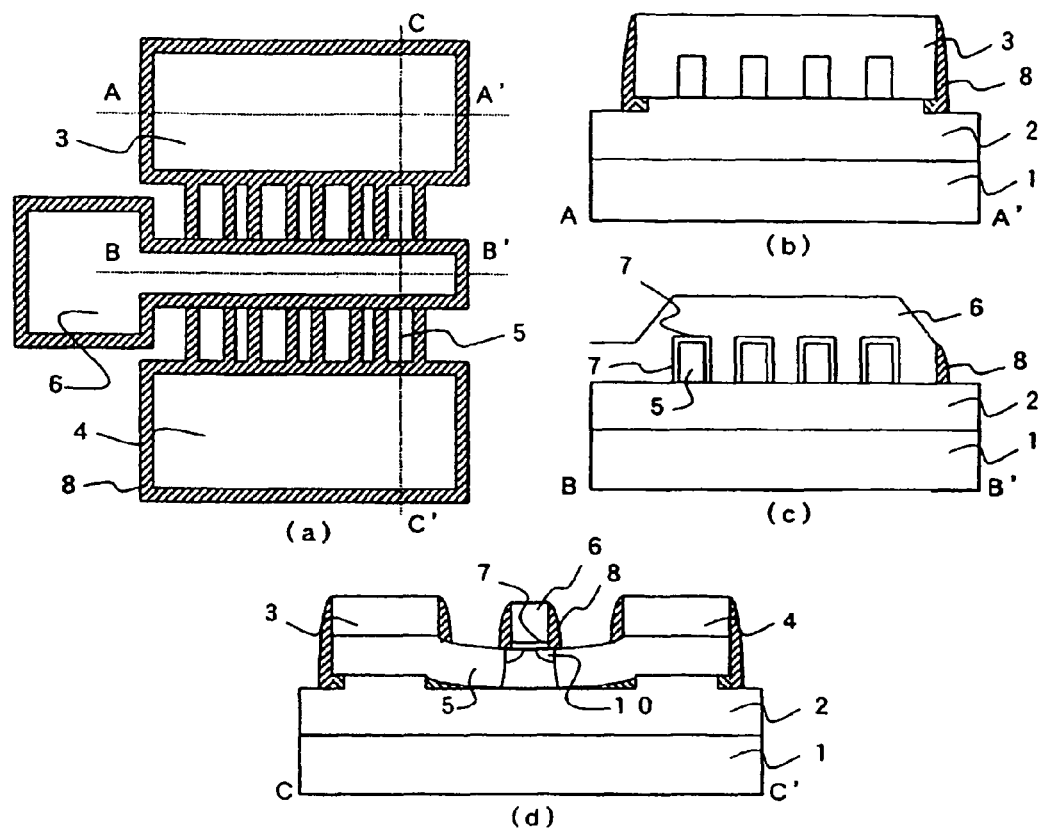
FIG. 17 shows Embodiment 3 (triple gate type FinFET).

FIGS. 16 and 17 schematically show Embodiment 3 of a semiconductor device of the present invention. FIG. 16(*a*) is a top view, and FIGS. 16(*b*), (*c*) and (*d*) are cross-sectional views taken on lines A-A', B-B' and C-C' of FIG. 16(*a*), respectively. FIG. 17(*a*) is a top view, and FIGS. 17(*b*), (*c*) and (*d*) are cross-sectional views taken on lines A-A', B-B' and C-C' of FIG. 17(*a*). FIG. 16 shows a double-gate type FinFET before forming a silicide. FIG. 17 shows a triple gate type FinFET before forming a silicide.

Embodiment 3 of the present invention is different from Embodiment 1 in a method for forming a pad of the source electrode 3 and a pad of the drain electrode 4. Reflecting the difference, the structures are partly different. A structural difference is that the pad of the source electrode 3 and the pad of the drain electrode 4 are elevated. The structure of the other part is the same structure as in Embodiment 1.

Figure 18:
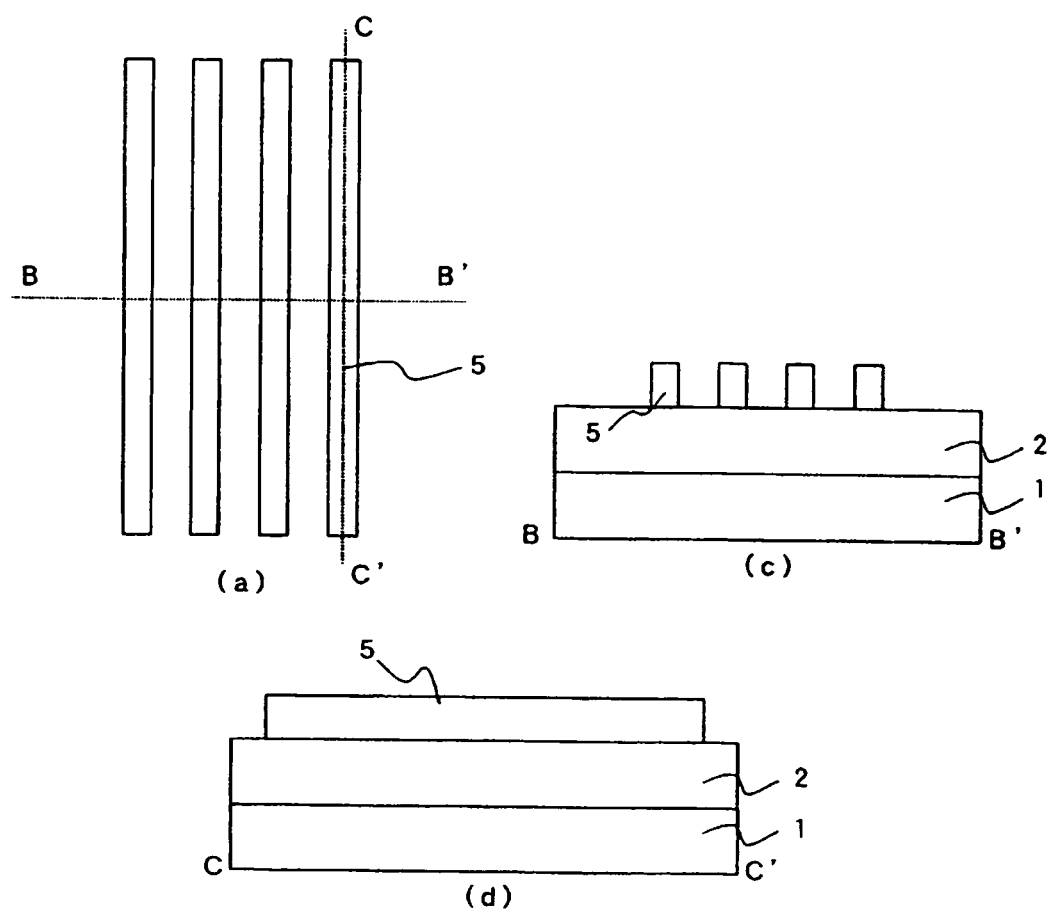
FIG. 18 is a process drawing illustrating a structure of Embodiment 3 in the course of production (after forming a fin).
Figure 19:
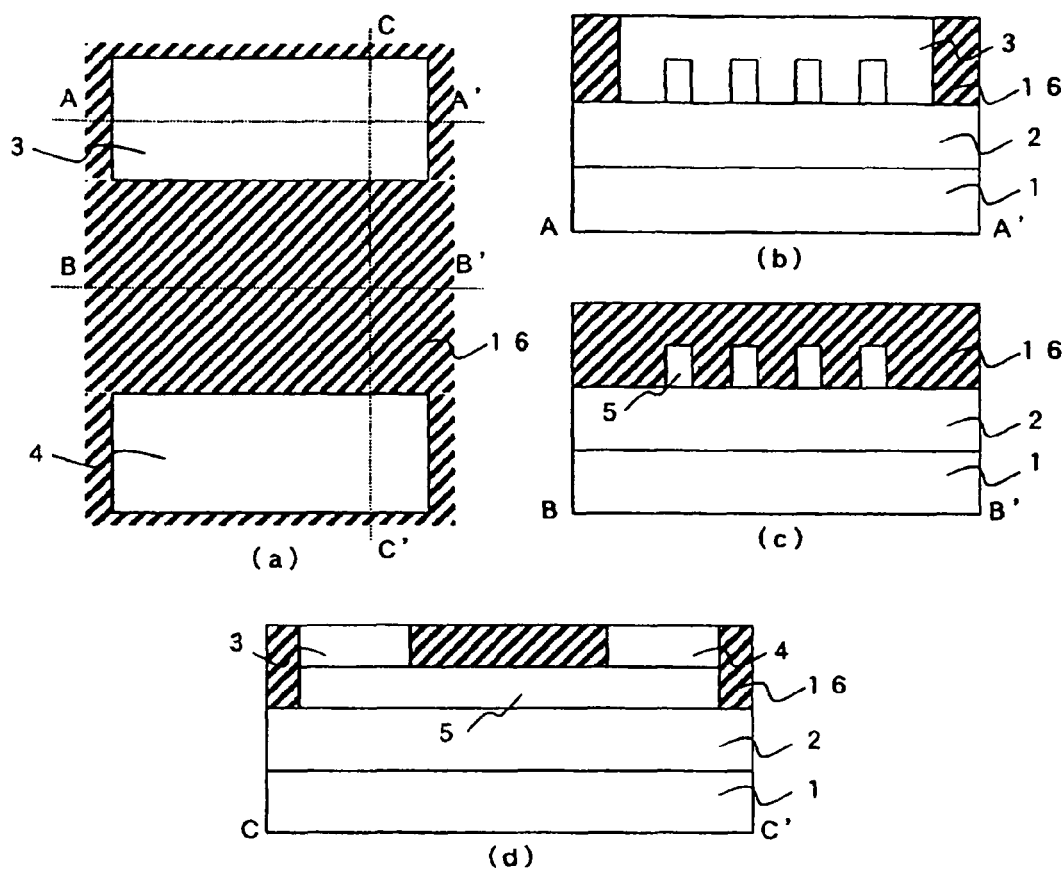
FIG. 19 is a process drawing illustrating a structure of Embodiment 3 in the course of production (after CMP).

There will be described a process for manufacturing Embodiment 3 with reference to FIGS. 18 to 20. First, there will be described a process for manufacturing a triple gate type FinFET (FIG. 17), which is similar to that for a double-gate type FinFET (FIG. 16) except some elements. The difference will be described later.

In this embodiment, first channel implantation is carried out as in Embodiment. Then, as shown in FIG. 18, lithography and dry etching are conducted to form only a pattern of the fin 5 in the SOI layer. After the etching, the resist is removed. Here, the reason why unlike Embodiment 1 or 2, only the pattern of the fin 5 is formed is that since the pattern is a simple line and space, its pitch can be reduced to the limit of lithography (for example, in the case of electron-beam lithography, when the pad of the source electrode 3 and the pad of the drain electrode 4 are near the fin 5, a resolution of the fin 5 is reduced due to backscatter electrons during drawing the pads.). If the pitch can be reduced, a current per a unit width can be increased. Considering that the pitch is reduced to the limit of lithography, all of the fins 5 are preferably in the same direction in a chip.

Then, an insulating film 16 (for example, a stacked film of SiO$_2$ and Si$_3$N$_4$) for a subsequent CMP(Chemical Mechanical Polishing) step is deposited; lithography and dry etching are executed to form a hole for the pad of the source electrode 3 and a hole for the pad of the drain electrode 4; and then the resist is removed. Then, a material for the pad of the source electrode 3 and the pad of the drain electrode 4 (for example, poly-Si) is deposited and then CMP is carried out. Thus, the state shown in FIG. 19 is obtained. Subsequently, the insulating film 16 for CMP is removed (FIG. 20). Thus, after the state corresponding to FIG. 3 in Embodiment 1 has been formed, the process from FIG. 4 in Embodiment 1 is conducted to obtain the state shown in FIG. 17.

In a double-gate type FinFET (FIG. 16), channel implantation is executed, a sacrifice oxidation film is removed and then a hard mask 9 is formed on a substrate. Then, lithography and dry etching are conducted to print only the pattern of the fin 5 formed by lithography on the hard mask 9. After removing the resist, the SOI layer is etched using the hard mask 9 as a mask. Then, an insulating film 16 for CMP is deposited; lithography and dry etching are carried out to form a hole for the pad of the source electrode 3 and a hole for the pad of the drain electrode 4; and the resist is removed. Here, in the case of the double-gate type FinFET, it is necessary to remove not only the insulating film 16 for CMP but also the hard mask 9 on the fin 5. The subsequent process is the same process as in a triple gate type FinFET. However, in a double-gate type FinFET, although extension implantation is conducted, extension is not formed in the upper surface of the fin 5 except a part in contact with the side surface because the hard mask 9 is present on the upper surface of the fin 5 as described in Embodiment 1. By the process described above, the state shown in FIG. 16 is obtained.

Figure 20:
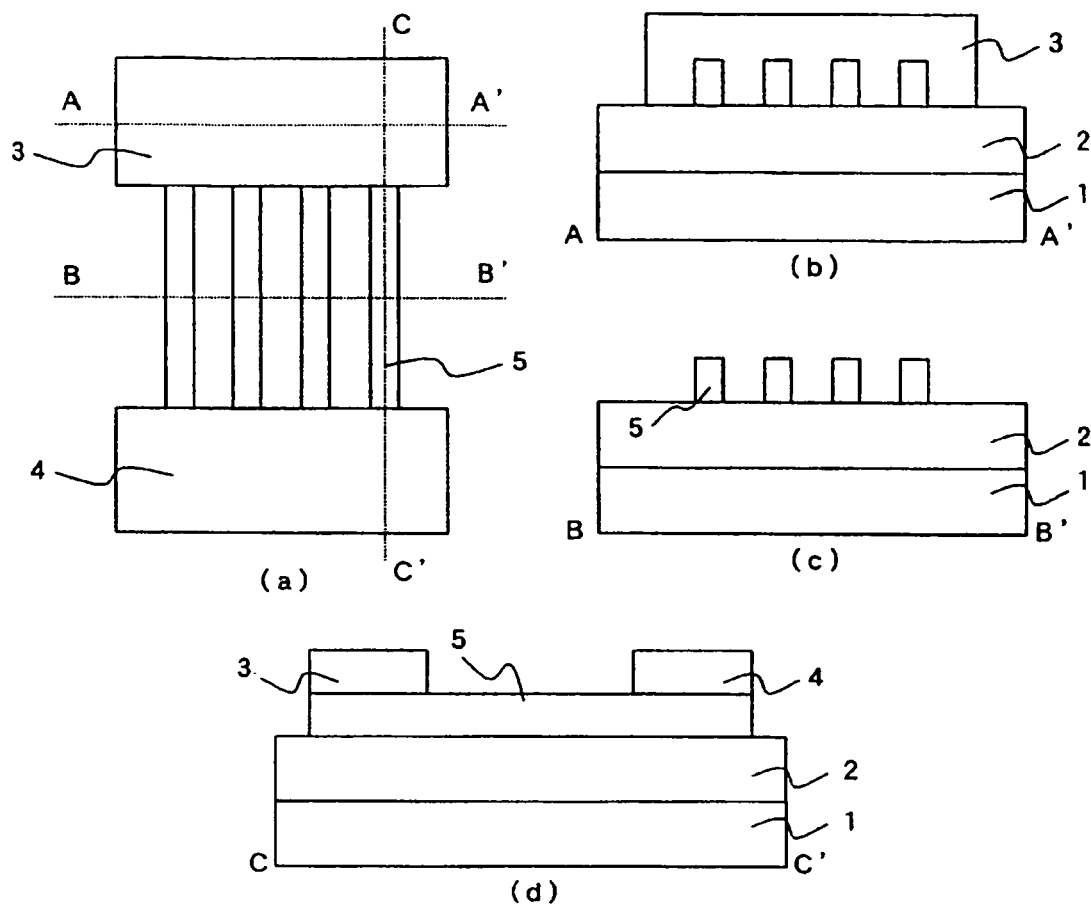
FIG. 20 is a process drawing illustrating a structure of Embodiment 3 in the course of production (after forming an electrode pad).

Although a process as described in Embodiment 1 is conducted after FIG. 20, a process as described in Embodiment 2 may be conducted after FIG. 20.

In this embodiment, the fin 5 is formed in advance in comparison with Embodiment 1 or 2 to allow the pitch of the fin 5 to be reduced to the limit of lithography performance, resulting in an advantage that a current per a unit width can be increased. Another advantage is that contact formation including the silicide step can be easier because the pad of the source electrode 3 and the pad of the drain electrode 4 are elevated.

Embodiment 4

Next, there will be described Embodiment 4 with reference to the drawings.

Figure 21:
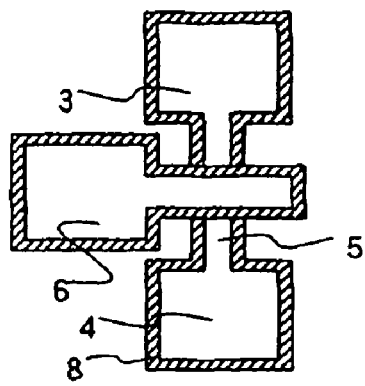
FIG. 21 is a top view showing Embodiment 4.
Figure 21:
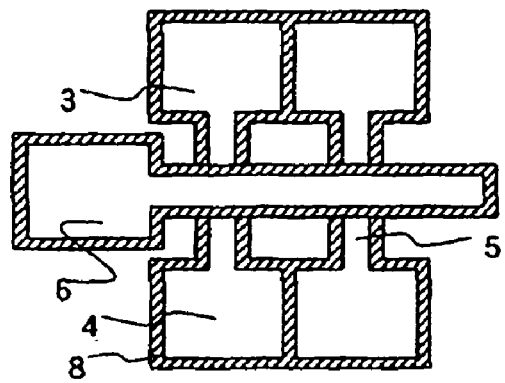
Figure 21:
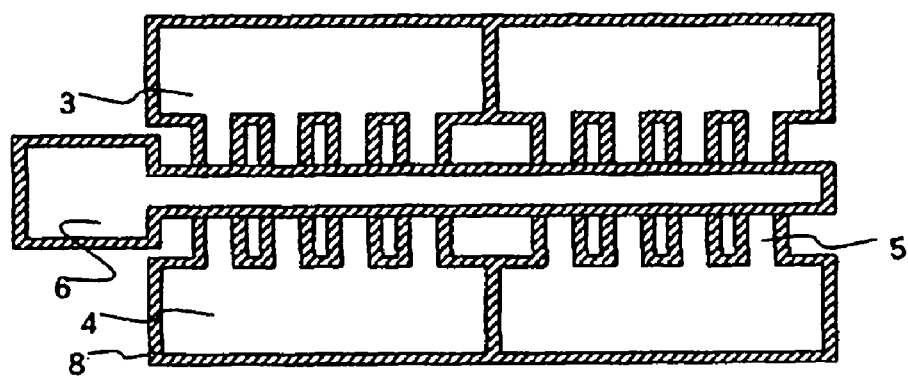
Figure 21:
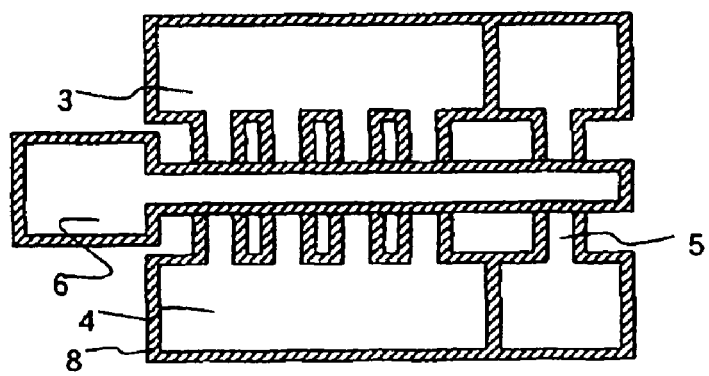
Figure 22:
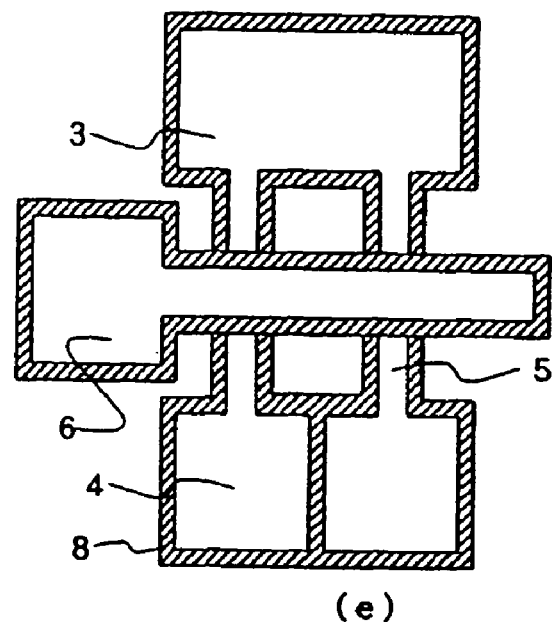
FIG. 22 is a top view showing Embodiment 4.
Figure 22:
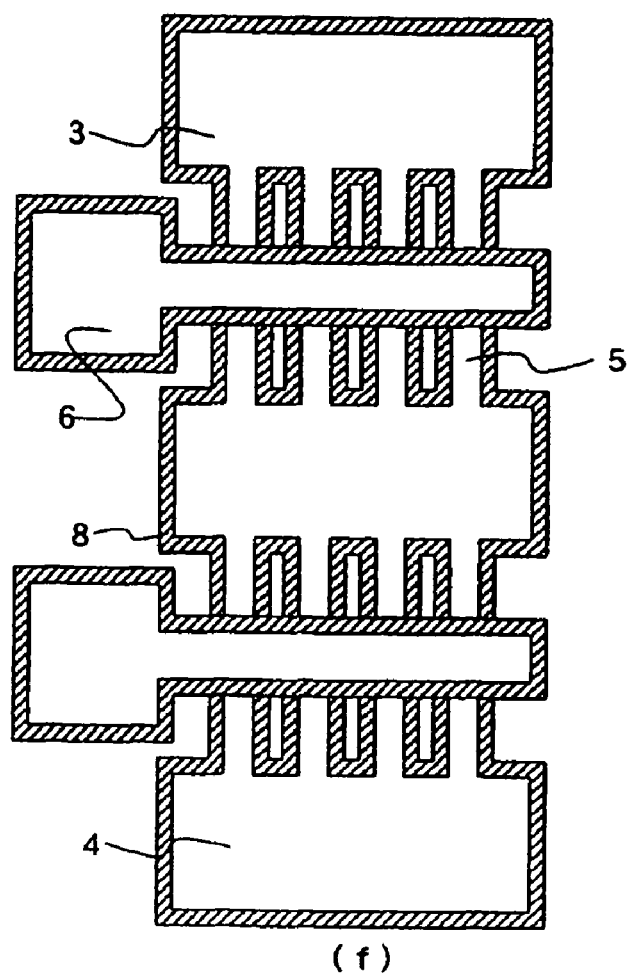

In Embodiment 4, an arrangement of the fin 5, the pad of the source electrode 3 and the pad of the drain electrode 4 is different from Embodiments 1, 2 or 3. In Embodiments 1 to 3, a pair of the pad of the source electrode 3 and the pad of the drain electrode 4 are connected via a plurality of the fins 5. In this embodiment, there will be shown an arrangement applicable to the present invention. FIGS. 21 and 22 describing an arrangement are top views showing the FinFET prepared by the manufacturing process of Embodiment 1, but a similar arrangement can be applied to the FinFET prepared by the manufacturing process of Embodiment 2 or 3.

First, there are two cases where one fin 5 is connected to a pair of the pad of the source electrode 3 and the pad of the drain electrode 4 (FIG. 21(a)) and where a plurality of (two or more) the fins 5 are connected (the case described above, for example FIG. 2(a)). Next, there is a case where a plurality of (two or more) pairs are aligned to one gate electrode. FIG. 21(b) shows the case where multiple (two or more) pairs of the pads of source electrodes 3 and the pads of the drain electrodes 4 connected to one fin 5 are aligned to one gate electrode, and FIG. 21(c) shows the case where multiple (two or more) pairs of the pads of the source electrodes 3 and the pads of the drain electrodes 4 connected to a plurality of fins 5 are aligned to one gate electrode. Alternatively, to one gate electrode can be aligned a pair of the pad of the source electrode and the pad of the drain electrode connected to one fin and a pair of the pad of the source electrode and the pad of the drain electrode connected to a plurality of fins (FIG. 21(d)). In the last case, the alignment order and the number of the pairs can be arbitrarily determined.

Furthermore, in the arrangement formed as identified above, adjacent electrode pads can be assembled. For example, FIG. 22(e) shows an example where pads of the source electrode 3 in FIG. 21(b) are assembled into one. When assembling electrode pads, it is possible to assemble electrodes constituting a pair of the pad of the source electrode 3 and the pad of the drain electrode 4 to different gate electrodes. For example, in 22(f), the pad of the drain electrode in the upper FinFET and the pad of the source electrode in the lower FinFET are assembled.

In the present invention, any of the manufacturing process in Embodiments 1 to 3 can be applied to a FinFET pattern formed by repeating the above-mentioned arrangement given number of times, and no changes are made in the process. Thus, the present invention can be applied any FinFET layout within an integrated circuit.

Embodiment 5

There will be detailed Embodiment 5 with reference to the drawings.

Figure 23:
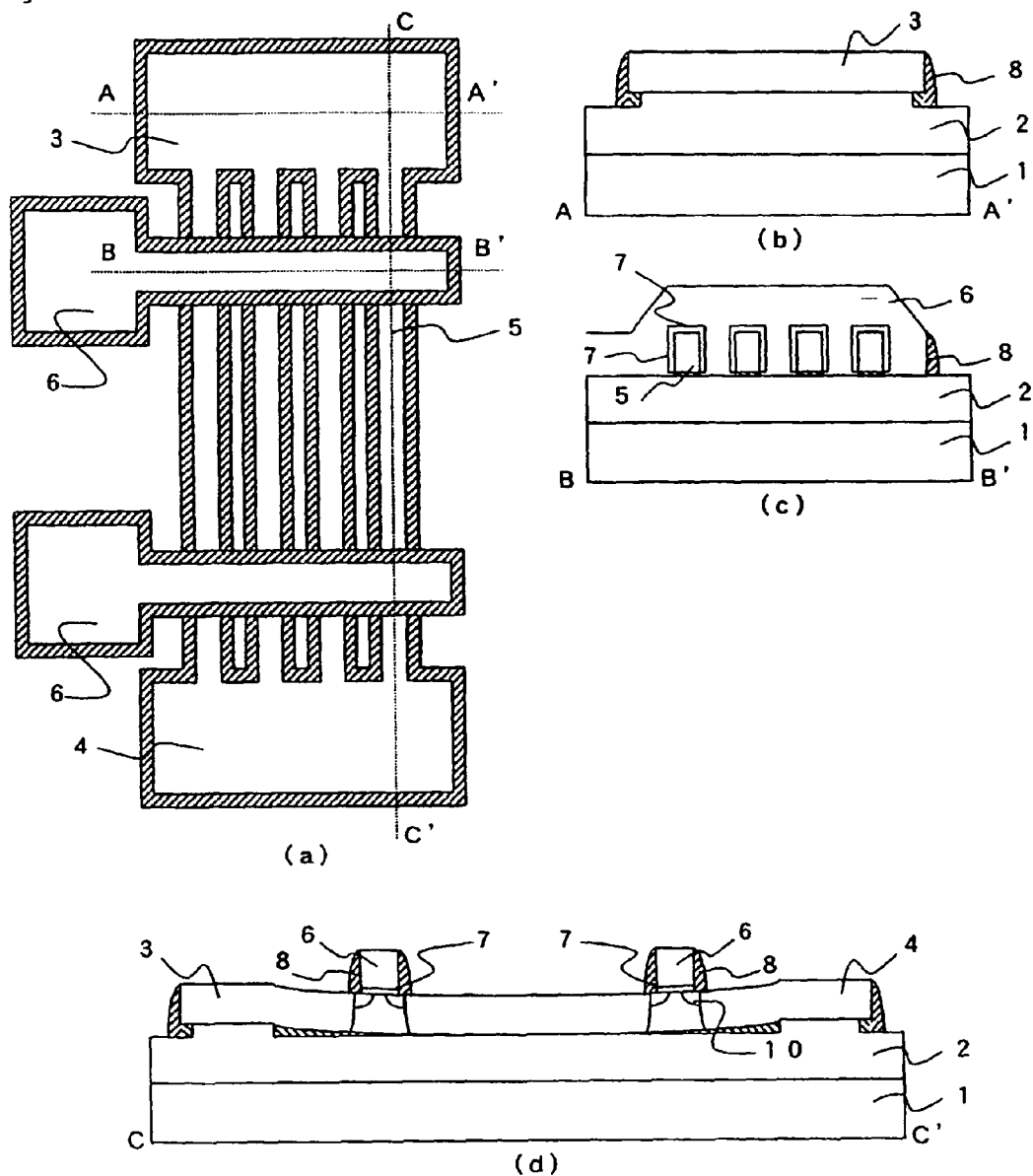
FIG. 23 shows Embodiment 5 (triple gate type FinFET, employing slit contact).
Figure 24:
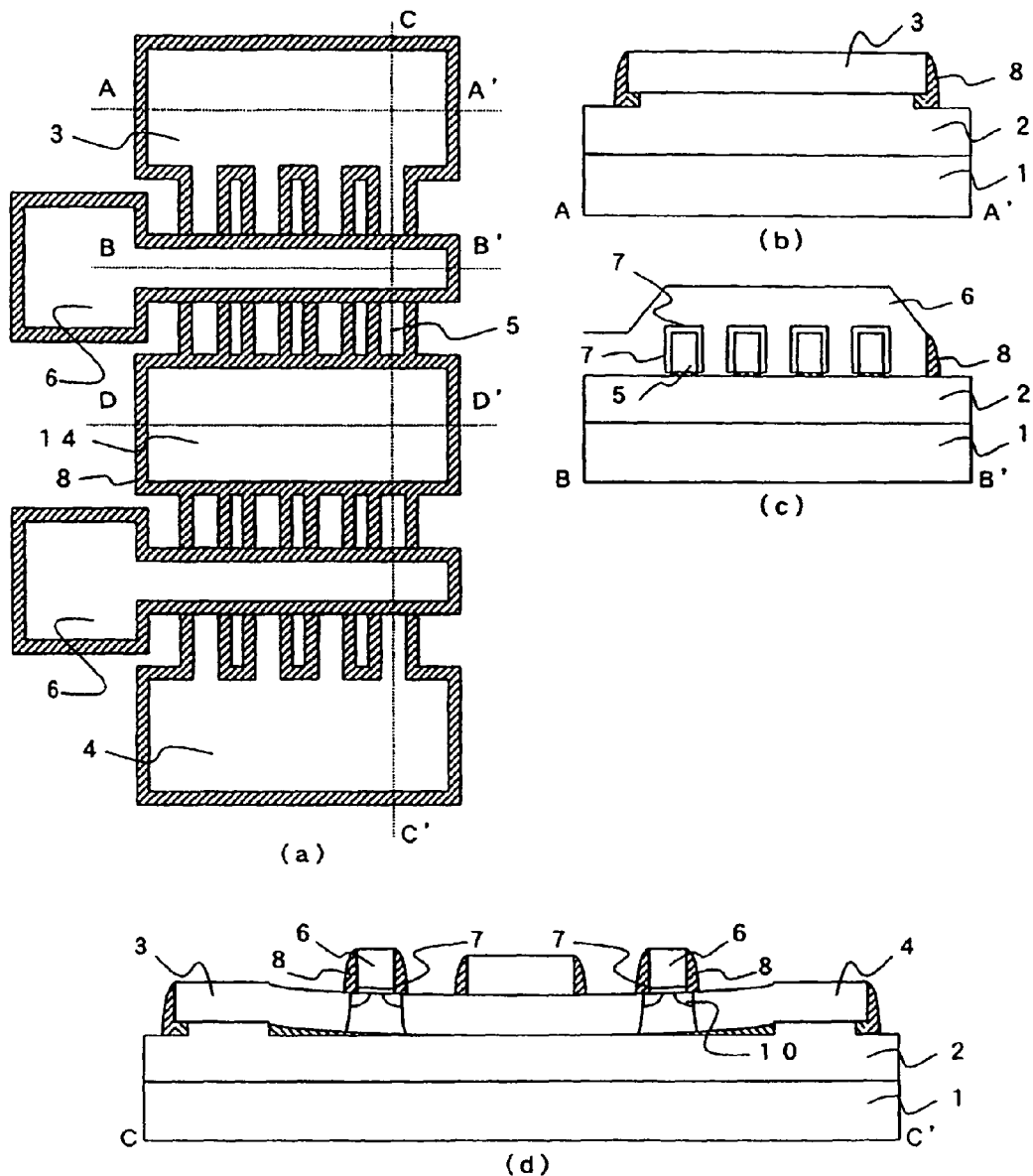
FIG. 24 shows Embodiment 5 (triple gate type FinFET).

FIGS. 23 and 24 schematically show Embodiment 5 of a semiconductor device of the present invention. FIG. 23(a) is a top view, and FIGS. 23(b), (c) and (d) are cross-sectional views taken on lines A-A', B-B' and C-C' of FIG. 23(a), respectively. FIG. 24(a) is a top view, and FIGS. 24(b), (c) and (d) are cross-sectional views taken on lines A-A', B-B' and C-C' of FIG. 24(a). FIGS. 23 and 24 show a triple gate type FinFET before forming a silicide.

Embodiment 5 is different from Embodiments 1 to 4 in either or both of a position where the gate electrode 6 in the FinFET is formed, the number of the gate electrodes formed. In Embodiments 1 to 4, the gate electrode is formed at the center of the deflected fin in contact with the substrate. Furthermore, only one gate electrode is formed from one fixed end to the other fixed end of the deflected fin in contact with the substrate. In FIGS. 23 and 24, the gate electrode 6 in the FinFET is formed not at the center of the deflected fin 5 in contact with the substrate, but is formed at a position other than the center of the points substantially dividing the fin 5 into quarters. Furthermore, a plurality of (two or more) the gate electrodes are formed from one fixed end to the other fixed end of the fin 5. Accordingly, a length from one fixed end to the other fixed end of the fin 5 is longer than that in the case where one gate electrode is formed. Since there is formed a contact at the center of the fin 5 in FIGS. 23 and 24, a length of the fin 5 becomes longer by a length required for forming the contact and a length required for forming another gate electrode. Difference between FIG. 23 and FIG. 24 is difference in taking an electrode at the center of the fin 5. In FIG. 23, so-called slit contact is employed, in which the fin 5 whose upper surface has a silicide is surrounded by a metal for contact. In FIG. 24, contact is taken by forming an electrode by depositing an electrode material (for example, poly-Si) on the fin as described in Embodiment 3.

Next, there will be described a manufacturing process of Embodiment 5. First, there will be described a process for manufacturing the embodiment in FIG. 23. The process for manufacturing the embodiment in FIG. 23 is the same process for manufacturing as described in Embodiment 1 before forming a silicide. Although the state before forming a silicide is as shown in FIG. 23, then a silicide is formed, an inter-layer insulating film is deposited, lithography and etching are conducted, a contact hole is formed, and then the hole is filled with a metal to form a contact. Here, the contact at the center of the fin 5 is formed as a slit contact, in which contact is taken such that the metal covers the fin.

Next, there will be described a process for manufacturing the embodiment in FIG. 24. The process for the embodiment in FIG. 24 is the same process as describe in Embodiment 1 before contacting the fin 5 with the substrate. Then, the steps corresponding to FIGS. 19 and 20 in Embodiment 3 are carried out to form an electrode 14 at the center. Specifically, an insulating film for CMP is deposited; lithography and dry etching are conducted to form a hole for the pad of the central electrode 14; and the resist is removed. Then, a material for the central electrode 14 (for example, poly-Si) is deposited and CMP is executed. Then, the insulating film 16 for CMP is removed.

Thus, after obtaining the state corresponding to FIG. 3 in Embodiment 1, the process from FIG. 4 in Embodiment 1 is conducted to obtain the state in FIG. 24. Then, a silicide is formed; an inter-layer insulating film is deposited; lithography and etching are carried out, a contact hole is formed, and the hole is filled with a metal to form a contact.

As described in the examples of this embodiment (FIGS. 23 and 24), it is not necessary in the present invention to form the gate electrode at the center of the deflected fin in contact with the substrate, but it can be formed at any appropriate position. There may be formed not only one gate electrode but also multiple (two or more) gate electrodes from one fixed end to the other fixed end of one deflected fin in contact with the substrate.

Although a triple gate type FinFET has been described as an example in this embodiment, to a double-gate type FinFET can be applied the features that a gate electrode is not necessarily formed at the center of the deflected fin in contact with the substrate, but can be formed at any appropriate position and that there may be formed not only one gate electrode but also multiple (two or more) gate electrodes from one fixed end to the other fixed end of one deflected fin in contact with the substrate.

Embodiment 6

Next, there will be described Embodiment 6 of the present invention with reference to the drawings. Although there has been described a FinFET using a deflected beam in the above embodiments, this embodiment shows an example where a deflected beam structure is used as a channel in a planar type FET.

Figure 25:
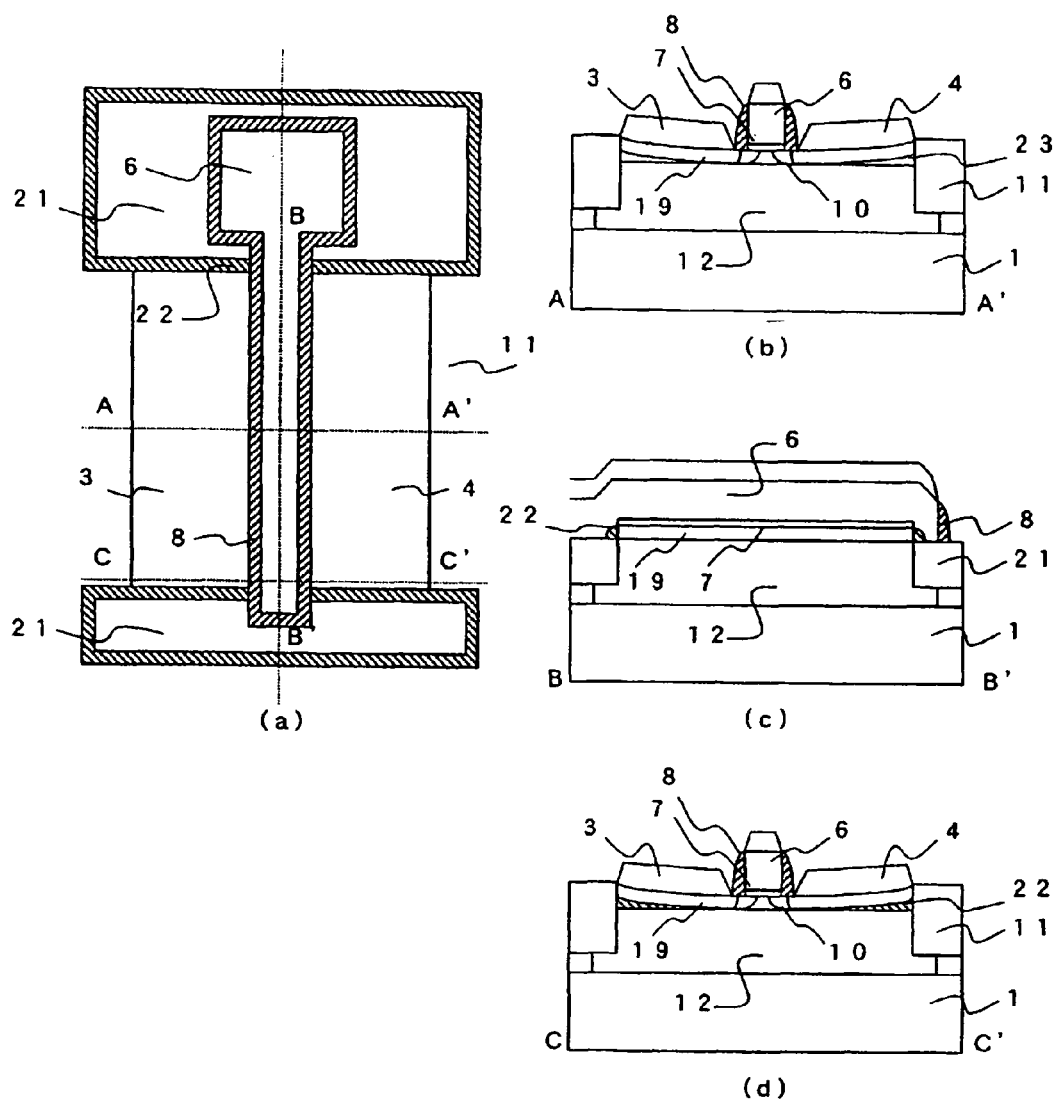
FIG. 25 shows Embodiment 6 (planar type MOSFET).

FIG. 25 shows the structure of the semiconductor device of Embodiment 6. FIG. 25(a) is a top view, and FIGS. 25(b), (c) and (d) are cross-sectional views taken on lines A-A', B-B' and C-C' of FIG. 25(a). FIG. 25 shows the state of a planar type MOSFET before forming a silicide.

Embodiment 6 is a planar type MOSFET where Si in a channel is deflected to be strained Si as shown in FIGS. 25(b) and (d). It has a significant structural difference from a conventional MOSFET (for example, FIG. 33) in that both ends of the surface Si layer are fixed by an STI 11 and the beam is deflected to be in contact with the substrate (practically, a well 12), and thus it is a characteristic of the present invention. Since the surface Si layer is fixed at both ends by the STI 11 and deflected, a lattice spacing of Si constituting the surface Si layer is microscopically extended in a A-A' direction (or C-C' direction), to be strained Si. Since strained Si allows mobility to be improved on the principle described above, this embodiment utilizes it as a channel of a planar type MOSFET.

For obtaining a structure where the surface Si layer is deflected to be in contact with the substrate, the MOSFET of this embodiment has other structural differences from a conventional one. First, as shown in FIGS. 25(a) and (c), a part of the STI surrounding the MOSFET is dug by etching back to be an STI 21. It is because an SON (Silicon on Nothing) structure is formed and used as a beam structure in this embodiment. After forming the beam structure, the beam is deflected for contact and then the region under beam is filled with an insulating film as described in Embodiment 1. However, it is generally difficult in a planar type MOSFET to fill the inner part with an insulating film, and the insulating film 22 fills only a part near the opening. Therefore, in the cross-section taken on line A-A' (FIG. 25(b)), spaces 23 are formed near the STI 11 under the source electrode 3 and near the STI 11 under the drain electrode 4, while in the cross-section taken on line C-C' (FIG. 25(d)), these spaces are filled with the insulating film 22.

Figure 33:
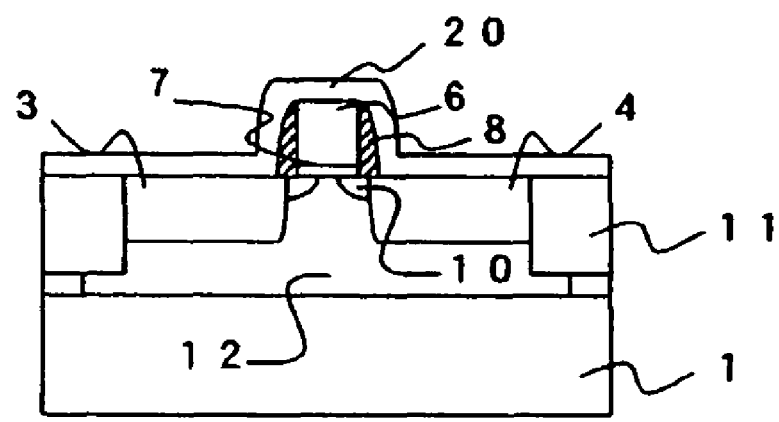
FIG. 33 is a cross-sectional view showing a device structure of a conventional MOSFET in which strain is applied by a capping layer.

Since this embodiment is a basically planar type MOSFET, its basic configuration is the same configuration as in a conventional MOSFET (for example, FIG. 33). The MOSFET of this embodiment is formed on a bulk Si substrate 1. In the upper surface of the strained Si 19 to be a channel is formed a gate insulating film 7, on which is further formed a gate electrode 6. The source electrode 3 and the drain electrode 4 have an elevated structure, and doped into an n-type in the case of a n-type MOSFET or into a p-type in the case of a p-type MOSFET, to be a deep electrode. The source electrode 3 and the drain electrode 4 are connected to a shallow extension 10 having the same doping type. Furthermore, there may be formed a halo having a different conduction type from the extension 10 in the vicinity of the extension 10 (not shown). The channel is doped into a p-type in the case of an n-type MOSFET or into an n-type in the case of a p-type MOSFET Although not being shown, it is not necessary in the planar type MOSFET described in this embodiment to form a gate electrode at the center of the deflected beam as described for the FinFET in Embodiment 5, but it may be formed at any appropriate position. Furthermore, a plurality of gate electrodes can be formed in a deflected beam.

Figure 26:
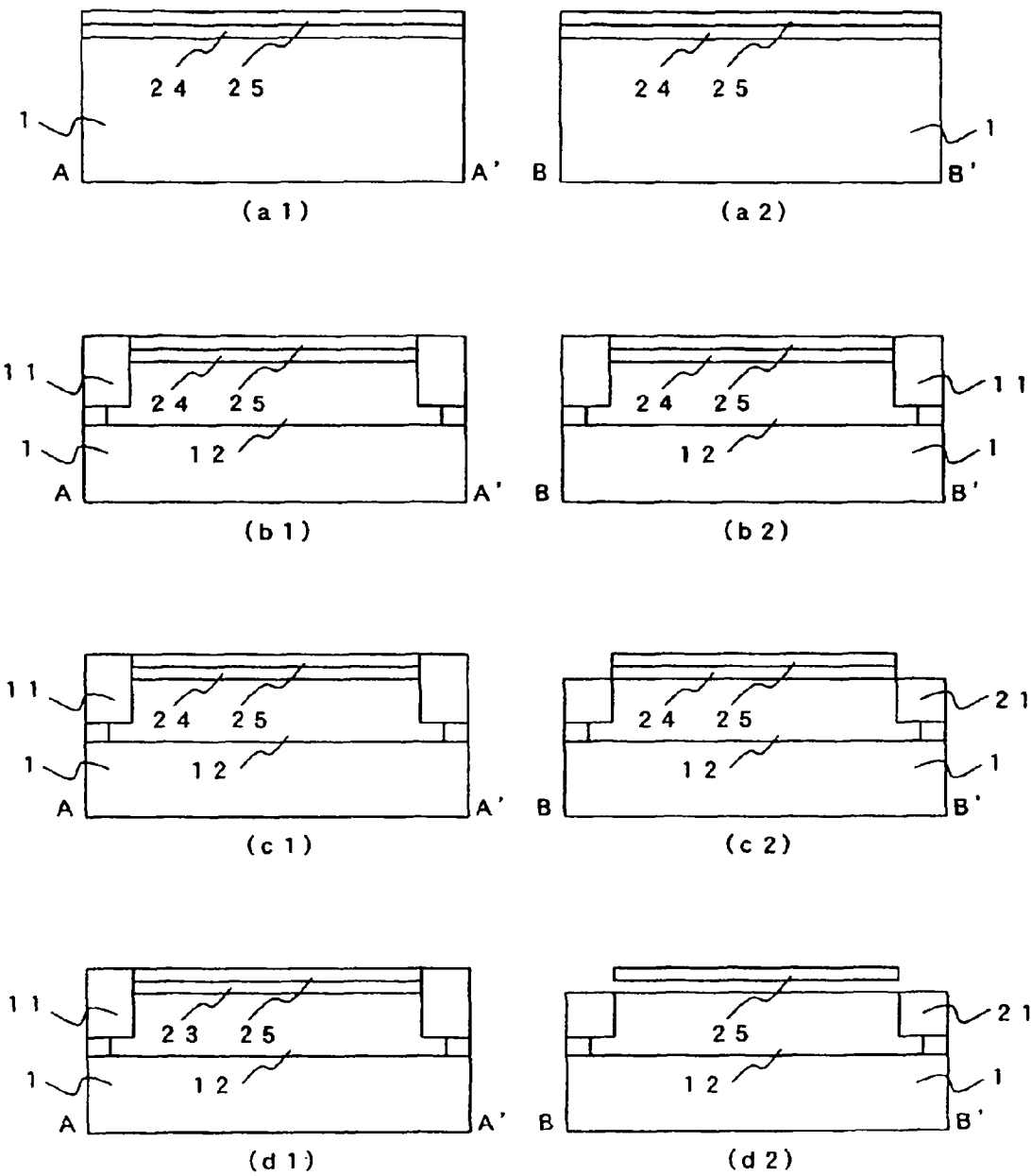
FIG. 26 shows a first stage of a manufacturing process for Embodiment 6.
Figure 27:
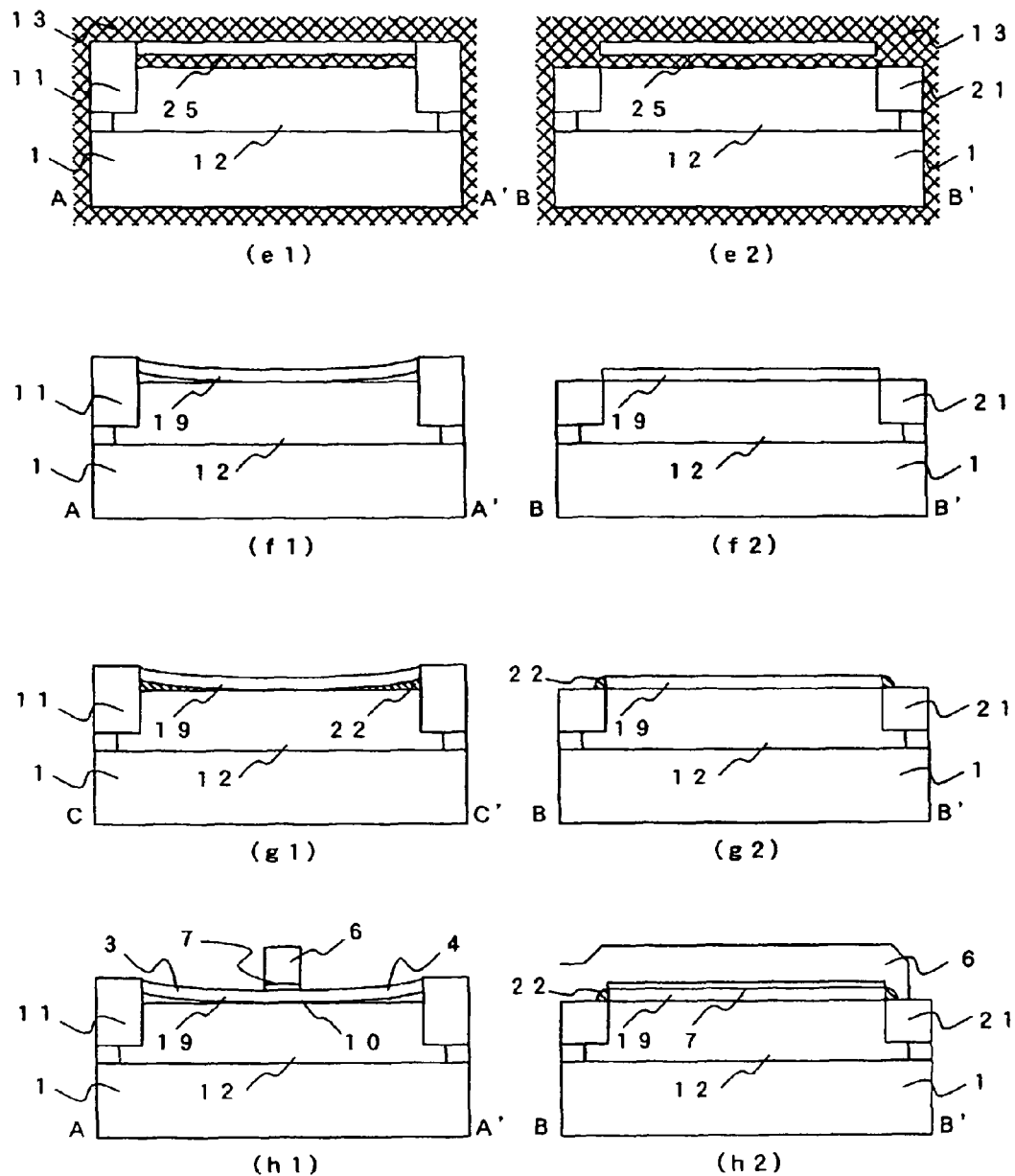
FIG. 27 shows a middle stage of a manufacturing process for Embodiment 6.
Figure 28:
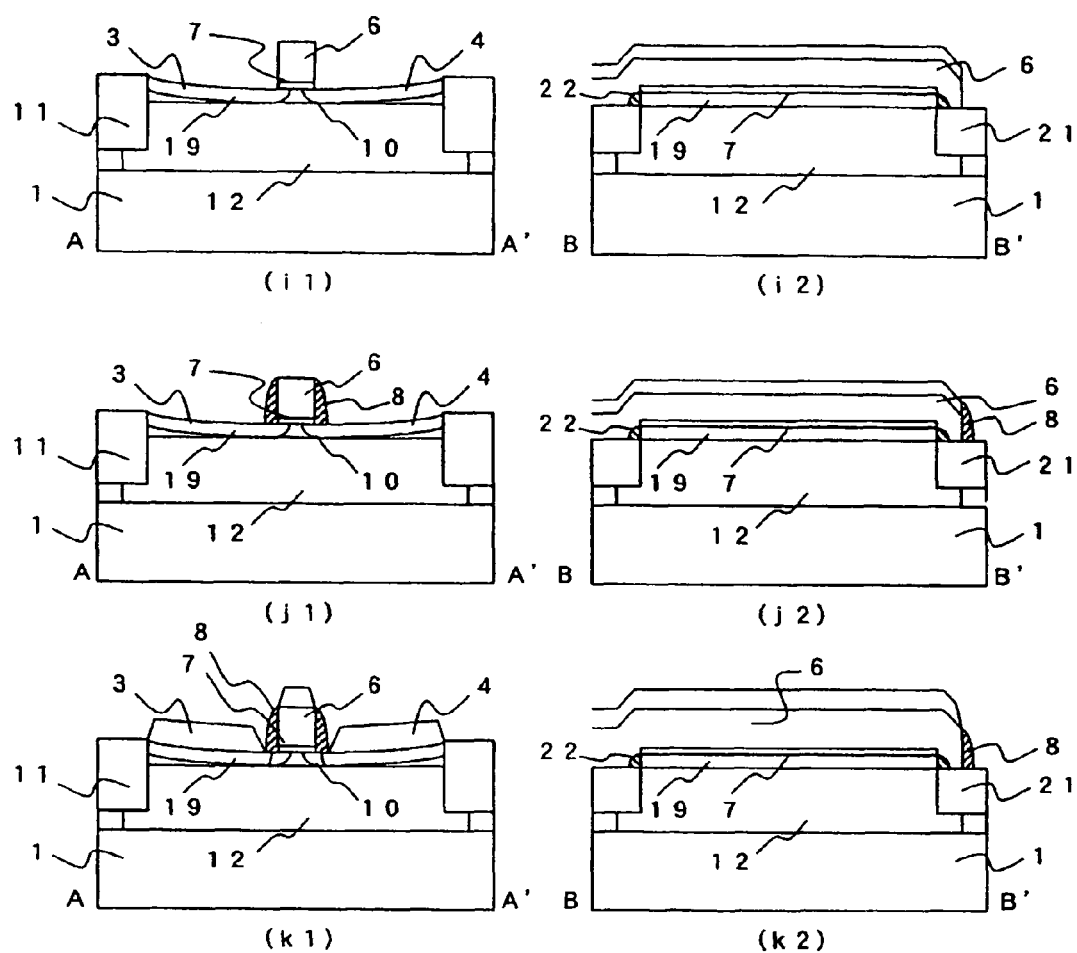
FIG. 28 shows a latter stage of a manufacturing process for Embodiment 6.

Next, there will be described a process for manufacturing Embodiment 6 with reference to FIGS. 26 to 28. Here, (a1), (b1) ... (k1) in FIGS. 26 to FIG. 28 are cross-sections taken on line A-A' of FIG. 25 (although only (g1) is a C-C' cross-section), and (a2), (b2) ... (k2) are cross-sections taken on line B-B' of FIG. 25.

Figure 31:
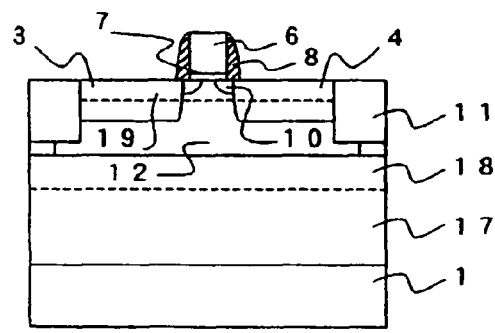
FIG. 31 is a cross-sectional view showing a device structure of a conventional strained Si MOSFET.
Figure 32:
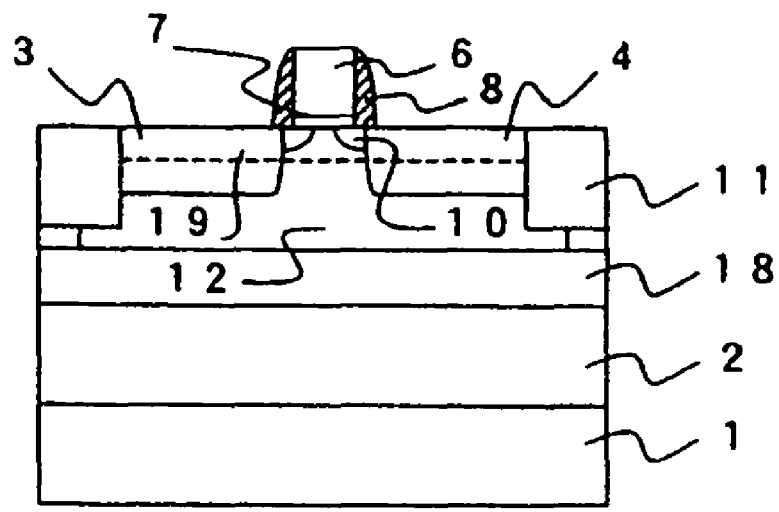
FIG. 32 shows a device structure of a conventional strain SOI MOSFET.

First, as shown in FIGS. 26(a1) and (a2), on a Si substrate 1 are epitaxially grown a SiGe layer 24 to a critical film thickness or less and then a Si layer 25 on the SiGe layer. Here it is important that the SiGe layer has a film thickness adequately thinner than the critical film thickness. Here, since the SiGe layer is not relaxed, its lattice constant is a Si lattice constant. Unlike a lattice-relaxed SiGe 18 in FIGS. 31 and 32, there are little defects or dislocations. For example, on a (100) bulk Si substrate are epitaxially grown SiGe (Ge composition ratio x=0.18) to 15 nm and then Si to 20 nm.

Subsequently, as shown FIGS. 26(b1) and (b2), the STI 11 is formed and ion implantation is conducted to form a well 12. Furthermore, the channel is ion-implanted. In this step, for example, the STI 11 with a depth of 250 nm is formed. Then, lithography is carried out, and in the region to be an n-type MOSFET, a p-type dopant is ion-implanted (for example, monovalent boron at an acceleration energy of 150 keV and a dosage of $1.5 \times 10^{13}$ cm$^{-2}$) to form a well 12. Furthermore, a p-type dopant is ion-implanted (for example, monovalent boron at an acceleration energy of 30 keV and a dosage of $7 \times 10^{12}$ cm$^2$) for ion implantation of the channel region. After the ion implantation, the resist is removed. Then, lithography is again executed, and in the region to be a p-type MOSFET, an n-type dopant is ion-implanted (for example, monovalent phosphorous at an acceleration energy of 350 keV and a dosage of $1.5 \times 10^{13}$ cm$^{-2}$) to form a well 12. Then, an n-type dopant is ion-implanted (for example, monovalent arsenic at an acceleration energy of 100 keV and a dosage of $2.8 \times 10^{12}$ cm$^{-2}$) for ion implantation of the channel region. After the ion implantation, the resist is removed.

Next, as a characteristic step in the MOSFET of the present invention, lithography and dry etching are conducted to etch back a part of the STI surrounding the MOSFET as shown in FIG. 26(c2), to form an STI 21. The etching-back depth may be such that the side surface of the SiGe layer 24 is exposed, and it may be etched back deeper than that the SiGe layer 24. Since the Si layer 25 is delimited as a square by the STI in this embodiment, the STI 11 on the upper and the bottom sides of the delimited Si layer 25 is etched back to be an STI 21 in the arrangement in FIG. 25(a).

Then, as shown in FIGS. 26(d1) and (d2), only the SiGe layer 24 is selectively etched by isotropic plasma etching. As a result, a space 23 is formed under the surface Si layer 25, to give an SON structure. In this embodiment, this SON structure is used as a beam structure.

After forming the SON structure, the SON structure is immersed in a liquid 13 as shown in FIGS. 27(e1) and (e2), as described in Embodiments 1 to 5. The liquid 13 may be water.

Then, the liquid 13 is removed by drying as shown in FIGS. 27(f1) and (f2). During removing the liquid 13 by drying, the Si layer 25 is pulled toward the substrate direction by a surface tension of the liquid and deflected, and then be in contact with the substrate while keeping the state. Even after removing the liquid, an adherence of the substrate allows the deflected Si layer 25 to remain the state without restoring the deflected Si layer. Thus, a strained Si 19 to be a channel in the MOSFET is formed. In terms of a drying method, any drying method which passes through a gas-liquid equilibrium curve can be used. It is also as in a FinFET.

After forming the strained Si 19, the opening in the side surface under the strained Si 19 is closed by filling it with the insulating film 22 as shown in FIGS. 27(g1) and (g2). This step is carried out as follows. First, for example, a thin oxide film is formed to 2 nm (not shown), and then $Si_3N_4$ is deposited to 50 nm. Here, $Si_3N_4$ is deposited by CVD. Then, $Si_3N_4$ is etched back. At the time when $Si_3N_4$ in the region other than that under the strained Si 19 and the side surface is removed by the etching back, the etching back is stopped and the oxide film in the upper surface of the strained Si 19 is removed. The insulating film may be a monolayer $SiO_2$ or a monolayer $Si_3N_4$. Here, a difference from the FinFET in Embodiment 1 is that since a channel width in a planar type MOSFET is not small like the Fin width of the FinFET, an insulating film is not formed under the strained Si 19 under the center of the strained Si 19, that is, the position on line A-A' and thus the space remains (the state of FIG. 27(f1) remains.). Only a region near the opening in the side surface like the position on line C-C' is filled with the insulating film 22 as shown in FIG. 27(g1).

Then, a gate insulating film 7 is formed; a gate electrode material is deposited; lithography and dry etching are conducted to form a gate electrode 6. The gate insulating film 7 is removed except the region under the gate electrode 6 (FIGS. 27(h1) and (h2)). For example, an oxynitride film is formed to 1.2 nm, and then poly-Si is deposited to 75 nm. In terms of the materials for the gate insulating film 7 and for the gate electrode, those described in Embodiment 1 can be, in addition to the above materials, applied to this embodiment.

Subsequently, lithography and ion implantation are executed to form an extension 10 (FIGS. 28(i1) and (i2)). That is, an n-type dopant is ion-implanted in the region to be an n-type MOSFET. For example, monovalent arsenic is ion-implanted at an acceleration energy 2 keV and a dosage of $5 \times 10^{14}$ $cm^{-2}$. After the ion implantation of the n-type dopant, the resist is removed. Then, lithography is conducted and a p-type dopant is ion-implanted in the region to be a p-type MOSFET. For example, monovalent $BF_2$ is ion-implanted at an acceleration energy of 2 keV and a dosage of $5 \times 10^{14}$ $cm^{-2}$. After the ion implantation of the p-type dopant, the resist is removed.

Then, a sidewall insulating film 8 is formed (FIGS. 28(j1) and (j2)). For example, $Si_3N_4$ as a material to be a sidewall insulating film is deposited to 50 nm, and then etching is conducted to form a sidewall. The sidewall insulating film may be any of the other materials or a combination of multiple materials described in Embodiment 1.

Subsequently, as shown in FIGS. 28(k1) and (k2), Si is selectively and epitaxially grown to form a elevated structure of the source electrode 3 and the drain electrode 4. This structure is formed for reducing a resistance of the surface strained Si 19 during forming a contact because it is a thin film. The selective epitaxial growth of Si is carried out as described in Embodiment 1.

Then, ion implantation is executed to form a deep electrode. Lithography is conducted and an n-type dopant is ion-implanted in the region to be an n-type FinFET. For example, monovalent arsenic is ion-implanted at an acceleration energy of 8 keV and a dosage of $5 \times 10^{14}$ $cm^{-2}$ and then monovalent phosphorous is ion-implanted at an acceleration energy of 5 keV and a dosage of $4 \times 10^{15}$ $cm^{-2}$. After the ion implantation of the n-type dopant, the resist is removed. Then, lithography is conducted and a p-type dopant is ion-implanted in the region to be a p-type FinFET. For example, monovalent boron is ion-implanted at an acceleration energy of 2 keV and a dosage of $3 \times 10^{15}$ $cm^{-2}$. After the ion implantation of the p-type dopant, the resist is removed. Then, activated annealing (for example, spike annealing at 1055° C. for 0 sec) is conducted. Thus, the planar type MOSFET in FIG. 25 is prepared.

Then, a silicide step is carried out as described in Embodiment 1, and then a contact can be formed (not shown). The type of the silicide and a metal for the contact applicable to this embodiment are as described in Embodiment 1.

As described above, a deflected beam structure can be used as a channel to prepare a planar type MOSFET.

Although a beam structure is deflected in an A-A' direction in the above description, it can be deflected in a B-B' direction as a process. To that end, the etched-back STI 21 can be located at the position rotated by 90°. Then, the same process can be conducted to prepare a planar type MOSFET in which a beam structure deflected in a B-B' direction is used as a channel.

For example, since there have been a description that in a common planar p-type MOSFET having a channel in a <110> direction formed on a bulk Si(100) substrate, mobility can be experimentally more improved by applying tensile strain in a parallel direction to a gate electrode than in a vertical direction, deflection in a B-B' direction is better than deflection in an A-A' direction when this embodiment is employed.

The invention claimed is:

1. A semiconductor device, comprising:
   a beam adapted for a current to flow through,
   wherein the beam comprises a semiconductor and a deflected part,
   wherein the beam has a doubly-clamped beam structure in which both ends are fixed and tensile strain is applied in a beam direction,
   wherein an underfill is disposed on a lower surface of the deflected part.

2. The semiconductor device as claimed in claim 1, wherein the beam is used as a channel region in a field effect transistor (FET).

3. The semiconductor device as claimed in claim 2, wherein the FET comprises a FinFET which uses at least a side surface of the beam as a channel region.

4. The semiconductor device as claimed in claim 2, wherein the FET comprises a planar type FET which uses an upper surface of the beam as a channel region.

5. The semiconductor device as claimed in claims 1, wherein a center of the beam is in contact with a void bottom under the beam.

6. The semiconductor device as claimed in claim 5, wherein a strain in the beam is controlled by a length of the beam before the beam is deflected and a depth of the void under the beam.

7. The semiconductor device as claimed in claim 6, wherein the semiconductor device comprises a plurality of FinFETs and comprises at least two types of FinFETs in which the strain is differently introduced by altering at least one of the length of the beam before the beam is deflected and the depth of the void under the beam.

8. The semiconductor device of claim 1, wherein a void is formed underneath the deflected part, and wherein a length of the deflected part depends on a length of the beam before deflection, and a depth of the void.

9. The semiconductor device of claim 1, wherein a void is formed underneath the deflected part, and wherein a length of the deflected part is described by a formula:

Length of a deflected part=$2R \tan^{-1}(L/2/(R-d))$ wherein R comprises a radius of an arc of a deflection, wherein L comprises a length of the beam before the beam is deflected, and wherein d comprises a depth of the void.

10. The semiconductor device of claim 1, wherein the deflected part comprises substantially an arc shape.

11. The semiconductor device of claim 1, wherein a void is formed underneath the deflected part, and wherein a radius of an arc of a deflection in the deflected part is described by a formula:

$R=d/2+L^2/8/d$ wherein R comprises the radius of the arc of the deflection, wherein L comprises a length of the beam before the beam is deflected, and wherein d comprises a depth of the void.

12. The semiconductor device of claim 1, wherein a strain of the deflected part is determined from a difference between a length of the deflected part, and a length of the beam before the beam is deflected.

13. The semiconductor device of claim 1, wherein a void is formed beneath the beam, and wherein a strain of the deflected part is determined based on a ratio of a length of the beam before the beam is deflected, and a depth of the void.

14. The semiconductor device of claim 1, further comprising a gate electrode, a source electrode, and a drain electrode, wherein the source electrode and the drain electrode are located in the deflected part.

15. The semiconductor device of claim 1, wherein a strain of the deflected part is in a range from 0.1% strain to 2% strain.

16. The semiconductor device of claim 1, wherein the semiconductor device comprises a plurality of ones of said beam.

* * * * *